(12) United States Patent
Okuda et al.

(10) Patent No.: US 11,156,645 B2
(45) Date of Patent: Oct. 26, 2021

(54) SEMICONDUCTOR DEVICE

(71) Applicant: RENESAS ELECTRONICS CORPORATION, Tokyo (JP)

(72) Inventors: Masuo Okuda, Tokyo (JP); Akemi Watanabe, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 113 days.

(21) Appl. No.: 16/719,422

(22) Filed: Dec. 18, 2019

(65) Prior Publication Data

US 2020/0209289 A1 Jul. 2, 2020

(30) Foreign Application Priority Data

Dec. 28, 2018 (JP) .............................. JP2018-247124

(51) Int. Cl.
*G01R 19/25* (2006.01)
*G01R 19/257* (2006.01)
*G01R 27/14* (2006.01)

(52) U.S. Cl.
CPC ........... *G01R 19/257* (2013.01); *G01R 27/14* (2013.01)

(58) Field of Classification Search
CPC ...... G01R 19/25; G01R 19/257; G01R 27/14; G01R 1/30; H03M 1/00; H03M 1/001; H03M 1/0646; H03M 1/12; H03M 1/187; H03M 1/66
See application file for complete search history.

(56) References Cited

U.S. PATENT DOCUMENTS

| 8,120,345 | B2 * | 2/2012 | Akiyama ............... H02M 3/156 323/283 |
| 9,109,959 | B2 | 8/2015 | Nieddu et al. |
| 2014/0197975 | A1 * | 7/2014 | Cohen .................. H03M 1/129 341/155 |
| 2017/0310337 | A1 * | 10/2017 | Ichikawa ................ H03M 1/76 |

FOREIGN PATENT DOCUMENTS

EP  0744837 A2 * 11/1996 .......... H03M 1/1019

* cited by examiner

*Primary Examiner* — Son T Le
(74) *Attorney, Agent, or Firm* — McDermott Will & Emery LLP

(57) ABSTRACT

A semiconductor device includes an analog-digital conversion circuit that converts a voltage at a node between a reference resistor and a sensor resistor into output data, the reference resistor and the sensor resistor being connected in series. The semiconductor device calculates a resistance value of the sensor resistor using a first output data obtained in a first conversion phase and second output data obtained in a second conversion phase. In the first conversion phase, a high potential side voltage is applied to one end of the reference resistor and a low potential side voltage is applied to one end of the sensor resistor. In the second conversion phase, the low potential side voltage is applied to one end of the reference resistor and the high potential side voltage is applied to one end of the sensor resistor.

19 Claims, 16 Drawing Sheets

| DECODER INPUT SIGNAL | | DECODER OUTPUT SIGNAL |
|---|---|---|
| SWITCHING CONTROL SIGNAL Ssw | ADC OUTPUT SIGNAL Dadc | DAC INPUT SIGNAL |
| 0 | 0 | 0 |
| 0 | 1 | 1 |
| 1 | 0 | 1 |
| 1 | 1 | 0 |

27

DAC INPUT SIGNAL — ADC OUTPUT SIGNAL Dadc
SWITCHING CONTROL SIGNAL Ssw

| DECODER INPUT SIGNAL | | | DECODER OUTPUT SIGNAL | |
|---|---|---|---|---|
| SWITCHING CONTROL SIGNAL Ssw | ADC OUTPUT SIGNAL Dadc | | DAC INPUT SIGNAL | |
| | bit1 | bit0 | bit1 | bit0 |
| 0 | 0 | 0 | 0 | 0 |
| 0 | 0 | 1 | 0 | 1 |
| 0 | 1 | 0 | 1 | 0 |
| 0 | 1 | 1 | 1 | 1 |
| 1 | 0 | 0 | 1 | 1 |
| 1 | 0 | 1 | 1 | 0 |
| 1 | 1 | 0 | 0 | 1 |
| 1 | 1 | 1 | 0 | 0 |

SEMICONDUCTOR DEVICE

CROSS-REFERENCE TO RELATED APPLICATIONS

The disclosure of Japanese Patent Application No. 2018-247124 filed on Dec. 28, 2018 including the specification, drawings and abstract is incorporated herein by reference in its entirety.

BACKGROUND

The present invention relates to a semiconductor device, and, for example, to a semiconductor device for converting a detection signal of a resistance value change type sensor for detecting a change in a sense target by a change in a resistance value into a digital value and outputting the digital value.

Thermistors are widely used as sensors for measuring temperature. The thermistor is one of resistive components whose resistance changes with temperature. The thermistors are often used in automobiles. In an automobile, an intake air temperature, an exhaust gas temperature, an engine room temperature, and the like are measured and controlled in accordance with the temperature. In such an application, it is required to monitor the temperature obtained from the thermistor more accurately and with a short measurement period.

An example of a technique for measuring the resistance value of such a thermistor is disclosed in Patent Document 1. In the measurement circuit disclosed in Patent Document 1, a resistive component to be measured is connected in series to a pull-up resistor, a high potential side reference voltage Vp is applied to an upper end of the pull-up resistor, and a low potential side reference voltage Vn is applied to a lower end of the resistive component. An input voltage generated between the pull-up resistor and the resistive component is monitored using a triangular wave signal to generate a PWM signal having a duty ratio corresponding to the resistance value of the resistive component. At this time, since the duty ratio of the PWM signal changes depending on the resistance value of the resistive component, the duty ratio is counted by the digital circuit, and the resistance value of the resistive component is calculated based on the duty ratio and the resistance value of the pull-up resistor.

PRIOR-ART DOCUMENT

Patent Document

[Patent Document 1]
U.S. Pat. No. 9,109,959

SUMMARY

In the art described in Patent Document 1, the measurement time is determined by the measurement resolution, the counter frequency, and the voltage division ratio between the pull-up resistor and the resistance value of the resistive component. In order to realize a measurement range of $1\Omega$ to $1\ M\Omega$ by using the technique described in this document, a measurement period is reached to approximately ten or more milliseconds. Further, in the art described in Patent Document 1, it is necessary to perform PI control for adjusting the common voltage used for generating the triangular wave, and it takes time to adjust the common voltage. For this reason, the art disclosed in Patent Document 1 has a problem in that it takes much time to measure the resistance value.

Other objects and novel features will become apparent from the description of this specification and the accompanying drawings.

According to one embodiment, a semiconductor device includes an analog-to-digital convertor. The analog-to-digital convertor generates output data by converting a voltage level at a node between a reference resistor and a sensor resistor to a digital value when a first reference voltage is supplied to the reference resistor and a second reference voltage is supplied to the sensor resistor. The semiconductor device calculates a resistance value of the sensor resistor using first output data obtained in a first conversion phase in which a high-potential reference voltage is supplied as the first reference voltage and a low-potential reference voltage are supplied as the second reference voltage and second output data obtained in a second conversion phase in which the high-potential reference voltage is supplied as the second reference voltage and the low-potential reference voltage is supplied as the first reference voltage.

According to the first embodiment, the semiconductor device can acquire the resistance value of the sensor resistor with high accuracy and in a short time.

DETAILED DESCRIPTION

Figure 1:
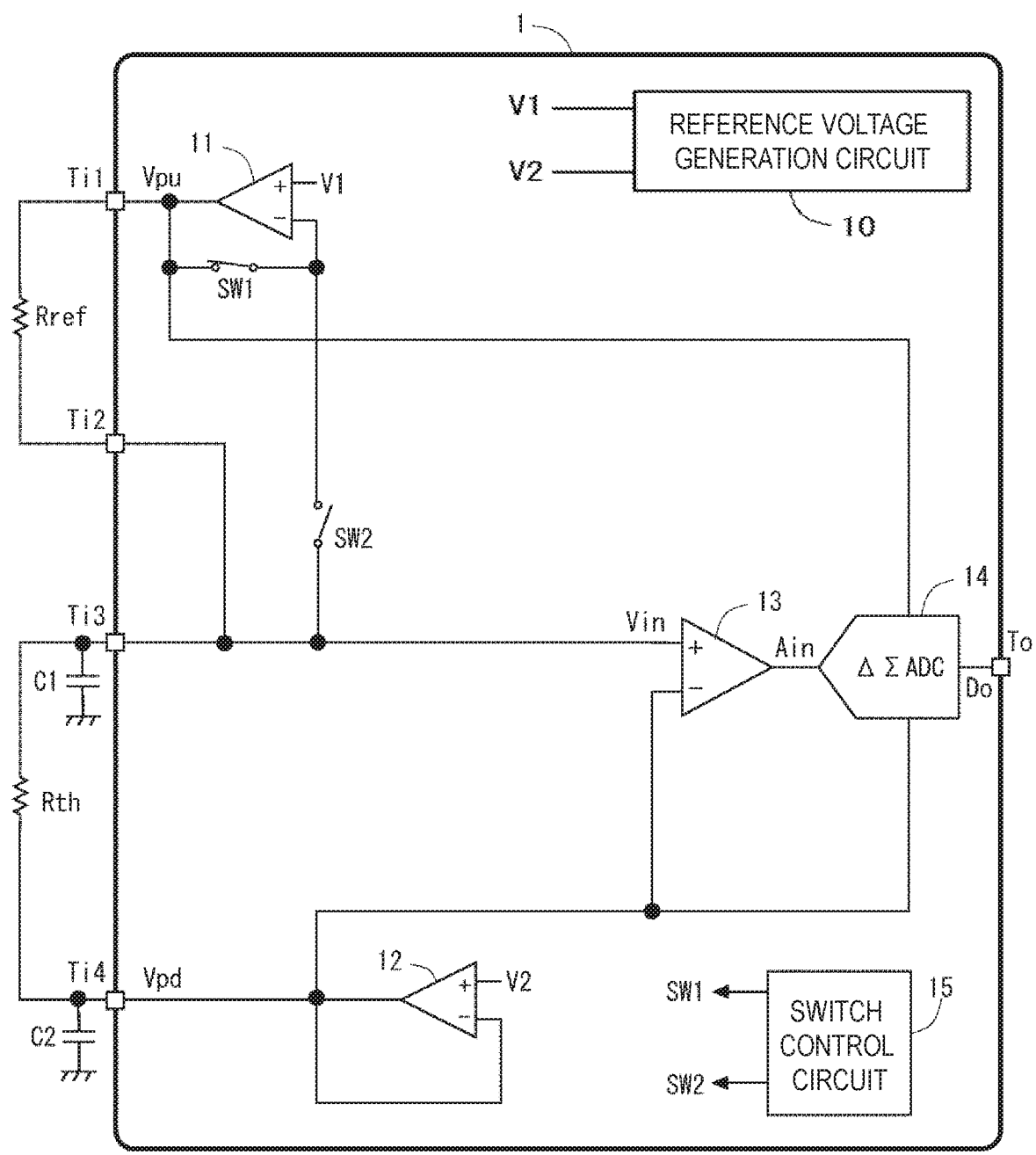
FIG. 1 is a diagram of the semiconductor device for first embodiment.

For clarity of explanation, the following description and drawings are appropriately omitted and simplified. In addition, the elements described in the drawings as functional blocks for performing various processes can be configured as a CPU (Central Processing Unit), memories, and other circuits, and be realized by programs loaded into the memories. Therefore, it is understood by those skilled in the art that these functional blocks can be realized in various forms by hardware alone, software alone, or a combination thereof, and the present invention is not limited to any of them. In the drawings, the same elements are denoted by the same reference numerals, and a repetitive description thereof is omitted as necessary.

Also, the programs described above may be stored and provided to a computer using various types of non-transitory computer readable media. Non-transitory computer readable media includes various types of tangible storage media. Examples of non-transitory computer-readable media include magnetic recording media (e.g., flexible disks, magnetic tapes, hard disk drives), magneto-optical recording media (e.g., magneto-optical disks), CD-ROM (Read Only Memory, a CD-R, a CD-R/W, solid-state memories (e.g., masked ROM, PROM (Programmable ROM), EPROM (Erasable PROM, flash ROM, RAM (Random Access Memory)). The program may also be supplied to the computer by various types of transitory computer-readable media. Examples of transitory computer-readable media include electrical signals, optical signals, and electromagnetic waves. The transitory computer readable medium may provide the program to the computer via wired or wireless communication paths, such as electrical wires and optical fibers.

First Embodiment

FIG. 1 shows a block diagram of a semiconductor device 1 according to the first embodiment. As shown in FIG. 1, in the semiconductor device 1 according to the first embodiment, a first resistor (e.g., a reference resistor Rref) and a second resistor (e.g., a sensor resistor Rth) are provided as discrete components. The semiconductor device 1 outputs output data Do corresponding to a resistance value of the sensor resistor Rth using a digital value corresponding to an input voltage obtained from the sensor resistor Rth. The sensor resistance Rth represents, for example, a resistance component whose resistance value changes in accordance with a surrounding environment such as a thermistor. The reference resistance Rref has a predetermined resistance.

As shown in FIG. 1, the semiconductor device 1 according to the first embodiment includes a reference voltage generation circuit 10, a first buffer (e.g., an operational amplifier 11), a second buffer (e.g., an operational amplifier 12), a pre-buffer 13, an analog-to-digital converter (e.g., a ΔΣ-ADC 14), and a switch control circuit 15. The semiconductor device 1 has a first switch (e.g., a switch SW1) and a second switch (e.g., a switch SW2).

The semiconductor device 1 according to the first embodiment has a first terminal Ti1, a second terminal Ti2, a third terminal Ti3, a fourth terminal Ti4, and an output terminal To. One end of the reference resistor Rref is connected to the first terminal Ti1. The second terminal Ti2 is connected to the other end of the reference resistor Rref. The third terminal Ti3 is connected to the second terminal Ti2 in the semiconductor device 1, and one end of the sensor resistor Rth and one end of a first capacitor C1 are connected to each other. The other end of the sensor resistor Rth and one end of a second capacitor C2 are connected to the fourth terminal Ti4. Here, the first capacitor C1 and the second capacitor C2 are capacitors provided for countermeasures against Electro Magnetic Interference noises, and the other end is connected to the grounding terminal.

It should be noted that the same configuration as that of the semiconductor device 1 described in first embodiment can be configured by discrete components. In this case, the same function as that of the semiconductor device 1 described below can be realized by assembling each of the constituent elements shown by the semiconductor device 1 in FIG. 1 as discrete components with a universal substrate or a printed circuit board.

The reference voltage generation circuit 10 outputs a first reference voltage V1 and a second reference voltage V2. The reference voltage generation circuit 10 outputs one of the high potential side reference voltage Vp and the low potential side reference voltage Vn as the first reference voltage V1, outputs the other of the high potential side reference voltage Vp and the low potential side reference voltage Vn as the second reference voltage V2, and switches from V1:Vp, V2:Vn (V1:Vn, V2:Vp) to V1:Vn, V2:Vp (V1:Vp, V2:Vn) in a time division manner.

More specifically, in the semiconductor device 1 according to the first embodiment, one resistance value of the sensor resistor Rth are obtained by using two output data Do generated in two conversion phases in which the reference voltages applied to the reference resistor Rref and the sensor resistor Rth are reversed. Therefore, in the first conversion phase, the reference voltage generation circuit 10 outputs the high-potential-side reference voltage Vp as the first reference voltage V1 and outputs the low-potential-side reference voltage Vn as the second reference voltage V2. In the second conversion phase, the reference voltage generation circuit 10 outputs the low-potential-side reference voltage Vn as the first reference voltage V1 and outputs the high-potential-side reference voltage Vp as the second reference voltage V2. Details of the method of calculating the sensor resistance Rth will be described later.

Figure 2:
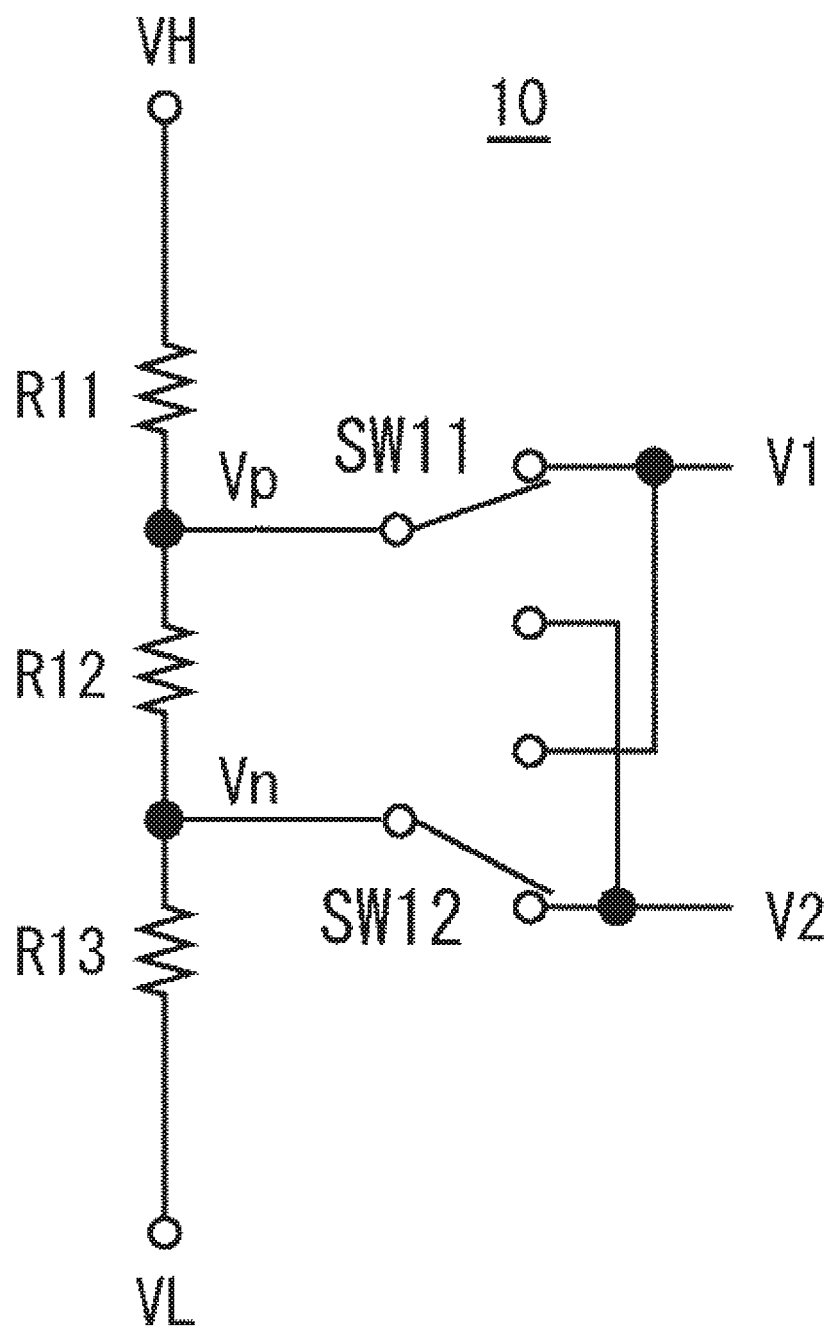
FIG. 2 is a circuit diagram showing an example of a reference voltage generating circuit according to the first embodiment.

FIG. 2 is a circuit diagram showing an exemplary reference-voltage generation circuit 10 according to the first embodiment. As shown in FIG. 2, the reference voltage generation circuit 10 includes resistors R11, R12, and R13, and switches SW11 and SW12. A high voltage power supply VH is supplied to one end of the resistor R11. The other end of the resistor R11 is connected to one end of the resistor R12. A high-potential-side reference voltage Vp is generated at a connection point connecting the resistor R11 and the resistor R12. The other end of the resistor R12 is connected to one end of the resistor R13. A low-potential-side reference voltage Vn is generated at a connection point connecting the resistor R12 and the resistor R13. A low voltage power supply VL is supplied to the other end of the resistor R13.

The switch SW11 has an input terminal connected to a node between the resistor R11 and the resistor R12 and two output terminals. One of the two output terminals is set to an output terminal (for example, a first node) from which the first reference voltage V1 is output, and the other is set to an output terminal (for example, a second node) from which the second reference voltage V2 is output. The switch SW12 also has an input terminal connected to a node between the resistor R12 and the resistor R13 and two output terminals.

One of the two output terminals is set to the output terminal of the first reference voltage V1, and the other is set to the output terminal of the second reference voltage V2. One of the switches SW11 and SW12 selects the first reference voltage V1 to output the input voltage while the other selects the second reference voltage V2 to output the input voltage. The switches SW11 and SW12 are controlled by the switch control circuit 15, though not shown.

In the semiconductor device 1 shown in FIG. 1, the reference voltage generation circuit 10 is provided in the semiconductor device, but the reference voltage generation circuit 10 may be provided outside the semiconductor device 1.

Referring to FIG. 1, a semiconductor device 1 according to the first embodiment will be further described. As shown in FIG. 1, in the operational amplifier 11, an inverting terminal and an output terminal are connected by a feedback wiring, and a first reference voltage V1 is input to a non-inverting terminal. That is, an output voltage (a positive reference voltage Vpu) of the operational amplifier 11 equals to the first reference voltage V1 and functions as a first buffer. The operational amplifier 11 applies the positive reference voltage Vpu to one end of the reference resistor Rref via the first terminal Ti1. A switching SW1 is inserted into a feedback line connecting the inverting terminal and the outputting terminal of the operational amplifier 11. The switch SW1 is controlled to be opened and closed by the switch control circuit 15.

In the operational amplifier 12, an inverting terminal and an output terminal are connected by a feedback wiring, and the second reference voltage V2 is input to a non-inverting terminal. That is, an output voltage (a negative reference voltage Vpd) of the operational amplifier 12 equals to the second reference voltage V2 and functions as a second buffer. The operational amplifier 12 applies the negative reference voltage Vpd to the other end of the sensor resistor Rth via the fourth terminal Ti4.

The negative reference voltage Vpd is input to an inverting terminal of the pre-buffer 13, and an input voltage Vin is input to a non-inverting terminal thereof. The pre-buffer 13 amplifies the input voltage Vin to generate an analog signal Ain. The ΔΣ-ADC 14 refers to the positive reference voltage Vpu and the negative reference voltage Vpd, and outputs output data Do having a digital value corresponding to the signal level of the analog signal Ain. Here, the ΔΣ-ADC 14 is a ΔΣ type analog-to-digital conversion circuit, but other type of analog-to-digital conversion circuit for converting an analog value into a digital value may be used. Details of the ΔΣ-ADC 14 will be described later.

The switch SW2 is provided between the inverting terminal of the operational amplifier 11 and the third terminal Ti3. The switch control circuit 15 is a sequencer which controls the open/close states of the switches SW1 and SW2 in accordance with a determined sequence. Details of the operation of the switch control circuit 15 will be described later.

Figure 3:
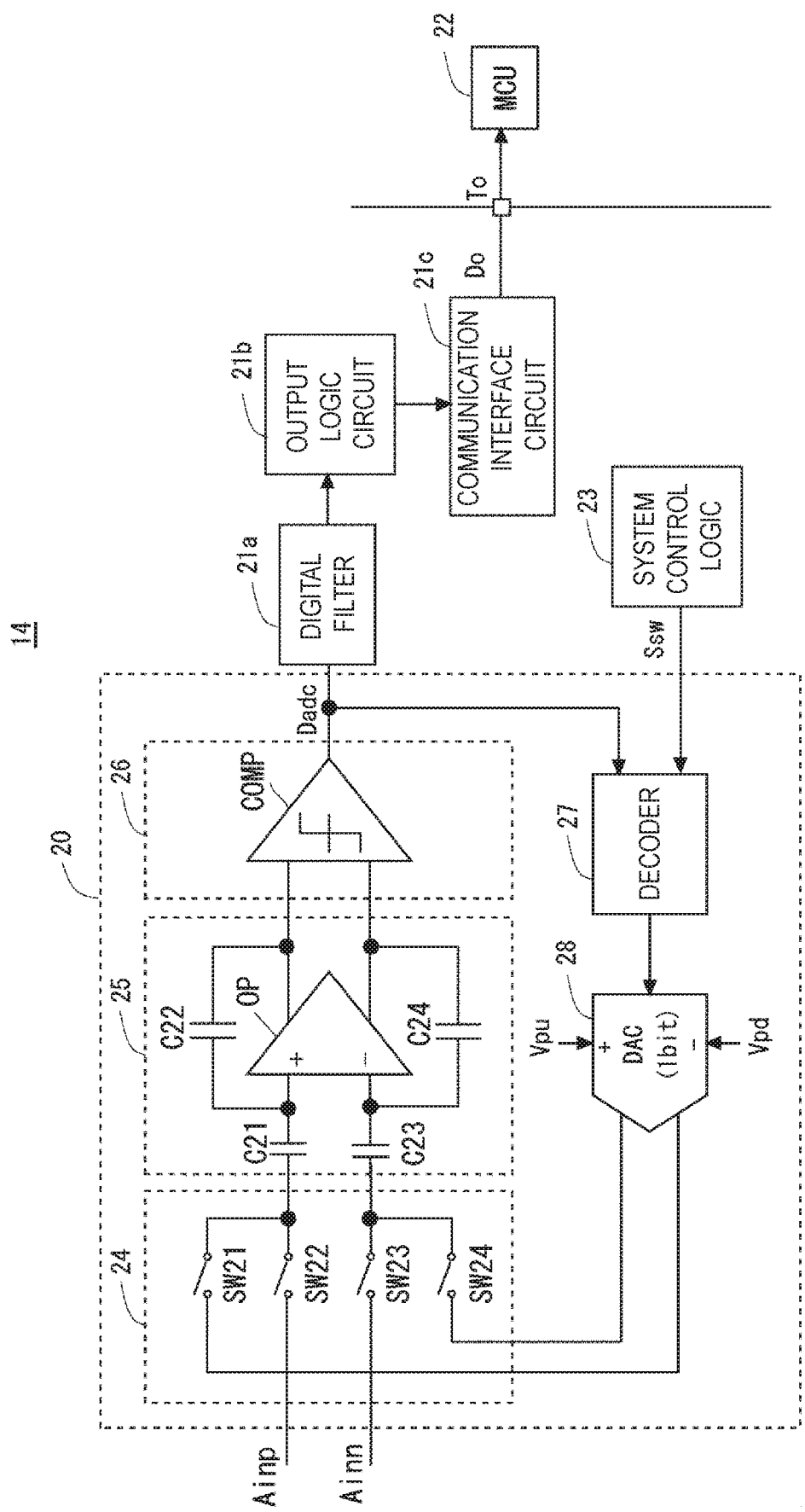
FIG. 3 is a block diagram of the A analog-to-digital converter circuit of the semiconductor device according to the first embodiment.

Details of the ΔΣ-ADC 14 will now be described. As described above, in the semiconductor device 1 according to the first embodiment, a magnitude relation between the positive reference voltage Vpu and the negative reference voltage Vpd applied to the ΔΣ-ADC 14 is switched by switching the voltage values of the first reference voltage V1 and the second reference voltage V2 by the reference voltage generation circuit 10. Therefore, the ΔΣ-ADC 14 has a configuration for correctly operating regardless of the switching of the reference voltage. FIG. 3 shows a block diagram of the A analog-to-digital converter of the semiconductor device according to the first embodiment.

As shown in FIG. 3, the ΔΣ-ADC 14 includes an ADC core 20, a digital filter 21a, an output logic circuit 21b, a communication interface circuit 21c, and a system control logic 23. The ADC core 20 includes an adder 24, a loop filter 25, an analog-to-digital converter 26, a decoder 27, and a DAC 28. The ΔΣ-ADC 14 shown in FIG. 3 is an example in which the analog signal Ain is inputted as a signal including the analog signals Ainp and Ainn having a mutually inverted relationship. In the embodiment shown in FIG. 3, it is assumed that the DAC 28 is a one-bit DAC which determines an analog value of a feedback signal to be outputted in accordance with an input value of one-bit digital signal.

In FIG. 3, an MCU (Micro Controller Unit) 22 provided outside the semiconductor device 1 is shown as an exemplary calculation unit for calculating the resistance of the sensor resistance Rth. The MCU 22 has an arithmetic unit capable of executing programs, stores the output data Do output by the ΔΣ-ADC 14 in a built-in memory, and calculates the sensor resistor Rth by referring to the output data Do stored in the memory. Further, the output logic circuit 21b notifies higher-level system located further above of the calculated resistance value of the sensor resistance Rth.

The adder 24 adds the analog signals Ainp and Ainn and the feedback signal output from the DAC 28, and outputs the result to the loop filter 25. The adder 24 includes switches SW21, SW22, SW23 and SW24 as sample-and-hold switches. The switches SW21 and SW22 have their outputs connected to each other and to the looped filter 25. One of the feedback signals output from the DAC 28 is input to an input terminal of the switch SW21. The analog signal Ainp is input to an input terminal of the switch SW22. The switches SW23 and SW24 have their outputs connected to each other and to the looped filtering 25. The other of the feedback signals outputted by the DAC 28 is inputted to an input terminal of the switching SW23. The analog signal Ainn is input to an input terminal of the switching SW24.

The loop filter 25 smooths output signals of the adder 24 and transmits the result signals to the analog-to-digital converter 26. The loop filter 25 includes an operational amplifier OP and capacitors C21, C22, C23, and C24. One end of the capacitor C21 is connected to the output of the switches SW21 and SW22. The other end of the capacitor C21 is connected to the non-inverting terminal of the operational amplifier OP. The capacitor C22 is provided between the non-inverting terminal and the output terminal of the operational amplifier OP. One end of the capacitor C23 is connected to the output of the switches SW23 and SW24. The other end of the capacitor C23 is connected to the inverting terminal of the operational amplifier OP. The capacitor C24 is provided between the inverting terminal and the output terminal of the operational amplifier OP.

The analog-to-digital converter 26 converts the output signals of the loop filter 25 into a digital output value Dadc. The analog-to-digital converter 26 has a comparator COMP. The comparator COMP switches the logical levels of the digital output values Dadc in accordance with a voltage level between the two output signals of the operational amplifier OP.

In the ΔΣ-ADC 14, the system control logic 23 and the decoder 27 are used as operation control circuits. The ΔΣ-ADC 14 uses the system control logic 23 and the decoder 27 to maintain a constant relationship between the digital output value Dadc and the analog value of the feedback signal regardless of the magnitude relationship between the first reference voltage V1 (e.g., the positive reference voltage Vpu) and the second reference voltage V2 (e.g., the negative reference voltage Vpd).

The decoder 27 decodes the digital output value and outputs a feedback digital value. This decoder 27 has two decode rules and switches the decode rules to be applied according to the two conversion phases set during one conversion cycle of semiconductor device 1. The first of the two decode rules is used in the first conversion phase in which the high potential side reference voltage Vp is output as the positive reference voltage Vpu and the low potential side reference voltage Vn is output as the negative reference voltage Vpd. The second decode rule is used in the second conversion phase in which the low potential side reference voltage Vn is output as the positive side reference voltage Vpu and the high potential side reference voltage Vp is output as the negative side reference voltage Vpd. The first decode rule and the second decode rule have a relationship in which the output result is inverted. In the example shown in FIG. 3, system control logic 23 is provided for switching the logic level of the control signal Ssw in response to the switching between the first conversion phase and the second conversion phase. The decoder 27 switches a decode rule to be applied in accordance with the control signal Ssw output from the system control logic 23. Details of the decoding rule of the decoder 27 will be described later.

In the DAC 28, a positive reference voltage Vpu is input to a positive reference voltage input terminal, a negative reference voltage Vpd is input to a negative reference voltage input terminal, and the feedback digital value is converted into an analog value by referring to the input positive reference voltage Vpu and the negative reference voltage Vpd to generate a feedback signal. The magnitude relationship between the positive reference voltage Vpu and the negative reference voltage Vpd is switched in accordance with the switching of the conversion phase.

The digital filter 21a performs a filtering process on the digital output-value Dadc. The output logic circuit 21b converts the digital output values Dadc processed by the digital filtering into digital codes corresponding to the voltage level of the input voltage Vin. The communication interface circuit 21c transmits the digital code generated by the output logic circuit 21b to an outside circuit. The communication interface circuit 21c is, for example, a communication interface circuit that performs SPI (Serial Peripheral Interface) communication. The communication system performed by the communication interface circuit 21c is not limited to the SPI communication. A communication protocol of the communication interface circuit 21c should match a communication protocol of the MCU 22. The MCU 22 may be located not only on the outside of semiconductor device 1, but also on the semiconductor substrate that constitutes semiconductor device 1.

The synthesizing process in the MCU 22 will be described. In the semiconductor device 1 according to the first embodiment, the output data Do is generated in each of two conversion phases in which the voltage values of the first reference voltage V1 and the second reference voltage V2 are interchanged. Therefore, in the MCU 22, the resistance of the sensor resistance Rth is calculated based on the equations (1) and (2).

[Equation 1]

$$dN_{ave} = \frac{dN\_v1 + dN\_v2}{2} \quad (1)$$

[Equation 2]

$$Rth = Rref \times \frac{dN_{ave}}{2^{ADCresolution} - dN_{ave}} \quad (2)$$

Here, dN_v1 in the equation (1) is output data Do corresponding to the input voltage Vin obtained in the first conversion phase, dN_v2 is output data Do corresponding to the input voltage Vin obtained in the second conversion phase, and dNave is the mean of these two values. The ADCresolution of Expression (2) is a resolution of the ΔΣ-ADC 14, Rref is the resistance value of the reference resistor Rref, and Rth is the resistance value of the sensor resistor Rth.

In the semiconductor device 1 according to the first embodiment, by calculating the resistance value of the sensor resistance Rth based on the mean value of the output data Do obtained in the two conversion phases, it is possible to obtain a high-precision resistance value in which an influence of an offset voltage or the like generated in the circuits constituting the semiconductor device 1 is canceled.

Figure 4:
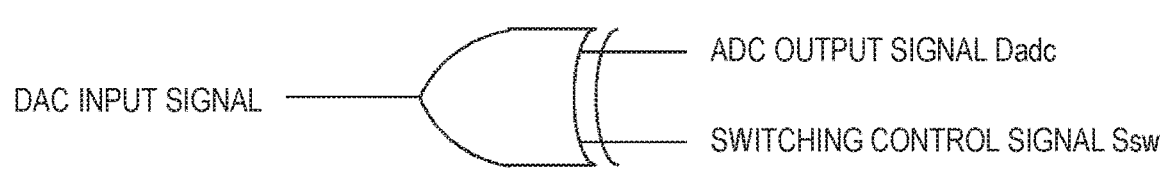
FIG. 4 is a circuit diagram showing an example of a table for explaining a decode rule of a decoder and a circuit example of the decoder in the first embodiment.

The decode rule of the decoder 27 will now be described. FIG. 4 is a table for explaining the decode rule of the decoder 27 according to the first embodiment and an exemplary circuit diagram of the decoder 27.

As shown in FIG. 4, the decoder 27 has a first decode rule when the value of the switching control signal Ssw is 0 and a second decode rule when the value of the switching control signal Ssw is 1. In the first decode rule, the output signal Dadc of the analog-to-digital converter 26 and the output value of the decoder 27 have the same value. On the other hand, in the second decode rule, the output value of the decoder 27 is inverted with respect to the output signal Dadc of the analog-to-digital converter 26. The operation of the table shown in FIG. 4 can be realized by, for example, an exclusive OR circuit.

The ΔΣ-ADC 14 uses the decoder 27 having such the decode rule so as not to break the operation of the ΔΣ-ADC 14 even when the positive reference voltage Vpu and the negative reference voltage Vpd applied to the DAC 28 are interchanged. When the voltage values of the positive reference voltage Vpu and the negative reference voltage Vpd are interchanged, the values of the feedback signals corresponding to the same digital output value Dadc are inverted, so that the original conversion functions cannot be maintained, and the operation of the ΔΣ-ADC 14 fails. However, by using the decoder 27, even when the voltage values of the positive reference voltage Vpu and the negative reference voltage Vpd are interchanged, the conversion function of the ΔΣ-ADC 14 can be maintained, so that the operation of the ΔΣ-ADC 14 does not have to be broken.

Figure 5:
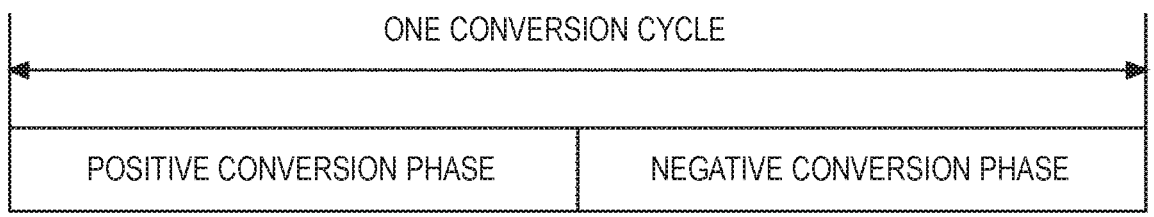
FIG. 5 is a diagram showing a conversion cycle of the semiconductor device in the first embodiment.

Next, the operation of the semiconductor device 1 according to the first embodiment will be described. FIG. 5 is a diagram for explaining the operation of one conversion cycle of the semiconductor device 1 according to the first embodiment. As shown in FIG. 5, the semiconductor device 1 according to the first embodiment has two conversion phases in one conversion cycle for obtaining one measured result. The first conversion phase is a positive conversion phase in which the high potential side reference voltage Vp is output as the first reference voltage V1 (and the positive side reference voltage Vpu), and the low potential side reference voltage Vn is output as the second reference voltage V2 (and the negative side reference voltage Vpd). The second conversion phase is a negative conversion phase in which the low potential side reference voltage Vn is output as the first reference voltage V1 (and the positive side reference voltage Vpu), and the high potential side reference voltage Vp is output as the second reference voltage V2 (and the negative side reference voltage Vpd).

In the semiconductor device 1 according to the first embodiment, the sensor resistor Rth is obtained by applying the output value dN_v1 obtained in the positive conversion phase and the output value dN_v2 obtained in the negative conversion phase to the equations (1) and (2) described above. Here, in the semiconductor device 1 according to the first embodiment, the times required for the respective conversion phases are shortened by operating the switches SW1 and SW2 to perform a pre-charge operation immediately after the positive conversion phase and the negative conversion phase are started. The operation of the semiconductor device 1 in the positive conversion phase and the negative conversion phase will now be described.

Figure 6:
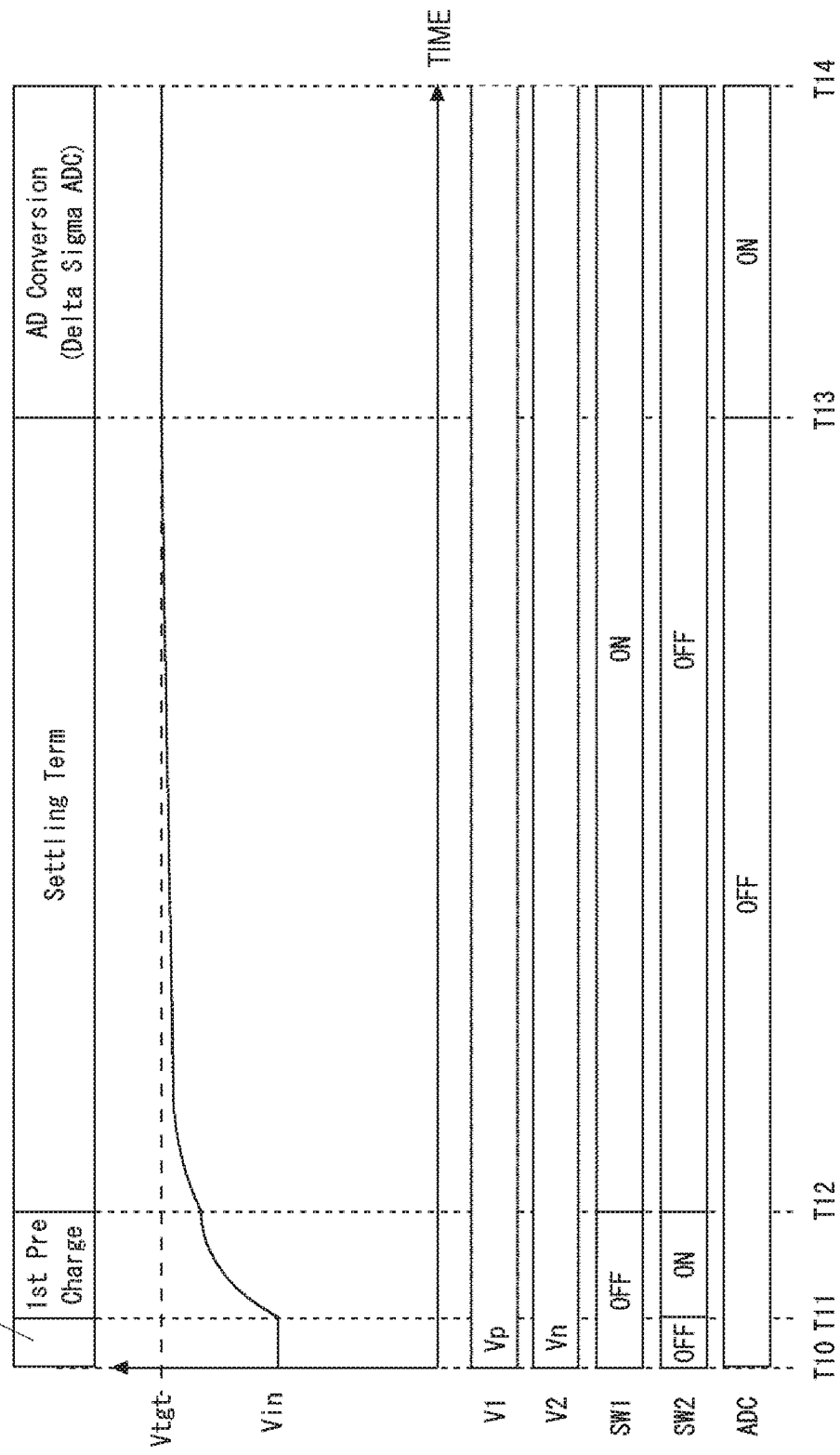
FIG. 6 is a timing chart showing a positive conversion phase of the semiconductor device in the first embodiment.

FIG. 6 is a timing chart for explaining the operation of the positive conversion phase of the semiconductor device according to the first embodiment. As shown in FIG. 6, in the positive conversion phase, first, during a phase switching period from timing T10 to timing T11, the first reference voltage V1 and the second reference voltage V2 to be output is set. Specifically, in the positive conversion phase, the high potential side reference voltage Vp is output as the first reference voltage V1, and the low potential side reference voltage Vn is output as the second reference voltage V2.

Subsequently, the semiconductor device 1 turns off the switch SW1 and turns on the switch SW2 in the first pre-charge period from the timing T11 to the timing T12. As a result, the operational amplifier 11 operates to raise the voltage on the third terminal Ti3 side of the sensor resistor Rth to the high potential side reference voltage Vp side.

Subsequently, the semiconductor device 1 turns on the switch SW1 and turns off the switch SW2 during a settling period from the timing T12 to the timing T13. As a result, the semiconductor device 1 regulates the input voltage Vin to the target voltage Vtgt corresponding to the resistance value of the sensor resistor Rth while the high potential side reference voltage Vp is supplied to one end of the reference resistor Rref by the operational amplifier 11 and the low potential side reference voltage Vn is supplied to the other end of the sensor resistor Rth by the operational amplifier 12.

Subsequently, in an analog-to-digital conversion processing period from the timing T13 to the timing T14, the semiconductor device 1 performs the analog-to-digital conversion processing on the input voltage Vin in a state in which the states of the switches SW1 and SW2 are maintained to be the same as in the settling period.

Figure 7:
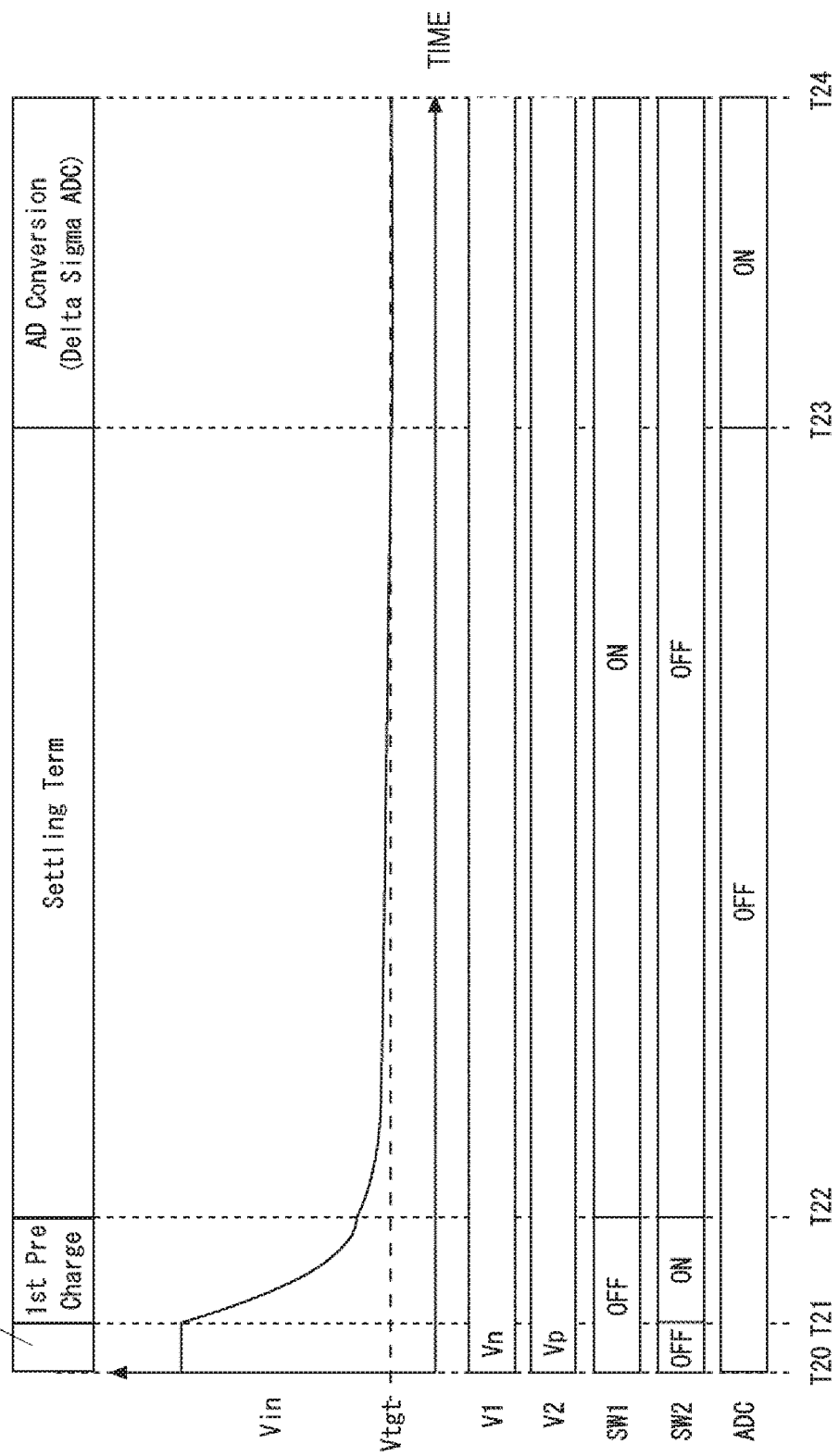
FIG. 7 is a timing chart showing a negative conversion phase of the semiconductor device in the first embodiment.

Next, FIG. 7 is a timing chart for explaining the operation of the negative conversion phase of the semiconductor device according to the first embodiment. As shown in FIG. 7, in the negative conversion phase, first, during a phase switching period from timing T20 to timing T21, the first reference voltage V1 and the second reference voltage V2 to be output is set. Specifically, in the negative conversion phase, the low potential side reference voltage Vn is output as the first reference voltage V1, and the high potential side reference voltage Vp is output as the second reference voltage V2.

Subsequently, the semiconductor device 1 turns off the switch SW1 and turns on the switch SW2 in a first pre-charge period from the timing T21 to the timing T22. As a result, the operational amplifier 11 operates so as to lower the voltage on the third terminal Ti3 side of the sensor resistor Rth to the low potential side reference voltage Vn side.

Subsequently, the semiconductor device 1 turns on the switch SW1 and turns off the switch SW2 during the settling period from the timing T22 to the timing T23. As a result, the semiconductor device 1 regulates the input voltage Vin to the target voltage Vtgt corresponding to the resistance value of the sensor resistor Rth while the low potential side reference voltage Vn is supplied to one end of the reference resistor Rref by the operational amplifier 11 and the high potential side reference voltage Vp is supplied to the other end of the sensor resistor Rth by the operational amplifier 12.

Subsequently, in an analog-to-digital conversion processing period from the timing T23 to the timing T24, the semiconductor device 1 performs the analog-to-digital conversion processing on the input voltage Vin in a state in which the states of the switches SW1 and SW2 are maintained to be the same as the settling period.

Figure 8:
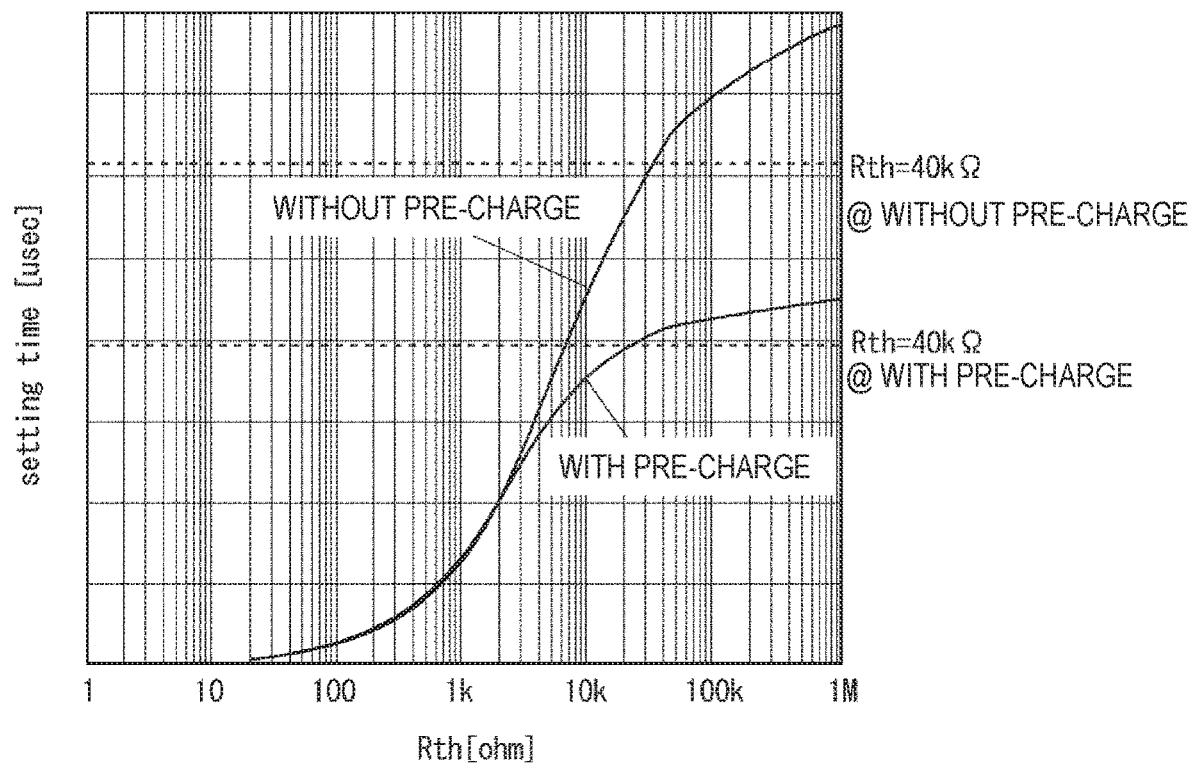
FIG. 8 is a graph explaining a setting time difference between "with pre-charge" and "without pre-charge" in the first embodiment.

In the semiconductor device 1 according to the first embodiment, in the first pre-charge time, the first capacitor C1 and the second capacitor C2 provided as external components are rapidly charged to shorten the pre-charge period. Here, the effect of shortening the charging time by providing the first pre-charge period will be described. FIG. 8 shows graphs for explaining the difference in pre-charge times according to "with pre-charge" or "without pre-charge" in the semiconductor device according to the first embodiment.

In the examples shown in FIG. 8, the curves show the relationship between the settling time and the resistance of the sensor resistance (Rth). In the "without pre-charge" curve, the switch SW1 is turned off and the switch SW2 is turned off in the first pre-charge period. In the "with pre-charge" curve, the switch SW1 is turned off and the switch SW2 is turned on in the first pre-charge period.

As shown in FIG. 8, in case of "with pre-charge", for example, approximately 30% reduction of time can be realized when the sensor resistance Rth is 40 kΩ. In addition, when the sensor resistance Rth is 1MΩ, approximately 40% reduction of time can be realized.

As described above, in the semiconductor device 1 according to the first embodiment, the measuring time is determined by the time required for settling the input voltage Vin to the target voltage Vtgt and the converting speed of the ΔΣ-ADC 14. In other words, in the semiconductor device 1 according to the first embodiment, the measurement time does not vary regardless of the measurement resolution, the counter frequency, and the voltage division ratio between the pull-up resistance and the resistance of the resistive component. Here, the conversion speed of the ΔΣ-ADC 14 can generally be realized much faster than the counter method described in Patent Document 1. Further, in the semiconductor device 1 according to the first embodiment, since the triangular wave is not used as in the art described in the document 1, there is no need to perform PI-control for adjusting the common voltages used for generating the triangular wave, and the measuring time can be shortened.

In the semiconductor device 1 according to the first embodiment, a switch SW1 is provided in the feedback path of the operational amplifier 11, and a switch SW2 is provided between the inverting terminal of the operational amplifier 11 and the third terminal Ti3 to which the sensor resistor Rth is connected. By turning off the switch SW1 and turning on the switch SW2 in the first pre-charge period set at the beginning of the conversion phase, the charging of the first capacitor C1 and the second capacitor C2 provided in association with the sensor resistor Rth can be accelerated, and the time required for the input voltage Vin to settle to the target voltage Vtgt can be shortened. In addition, by shortening the time required for the input voltage Vin to settle to the target voltage Vtgt, the time of one conversion-cycle can be shortened.

In the semiconductor device 1 according to the first embodiment, the first capacitor C1 and the second capacitor C2 are connected to the sensor resistor Rth, and the reference voltages are exchanged between the positive conversion phase and the negative conversion phase. The sensor resistance Rth has a large variation range from 1Ω to about 1 MΩ. Here, when the resistance value of the sensor resistor Rth is sufficiently larger than the resistance value of the reference resistor Rref, the voltage generated at the third terminal Ti3, for example, the target voltage Vtgt approaches the positive reference voltage Vpu as much as possible. Therefore, when the voltage of the third terminal Ti3 is settled from the voltage near the grounding voltage to the target voltage Vtgt, for example, in the positive conversion phase, the settling time becomes longer in proportion to the value of the sensor resistor Rth. The reason is that the settling time is determined based on a time constant determined by the first capacitor C1 and a combined resistance of the reference resistor Rref and the sensor resistor Rth, and the target voltage Vtgt determined by a divided voltage of the reference resistor Rref and the sensor resistor Rth. Also in the negative conversion phase in which the voltage of the third terminal Ti3 is settled from the voltage near the power supply voltage to the target voltage Vtgt, the settling time becomes longer in proportion to the value of the sensor resistor Rth as in the positive conversion phase.

In the semiconductor device 1 according to the first embodiment, when the sensor resistance Rth exhibits a high resistance, the voltage settling time of the third terminal Ti3 can be shortened by providing the first pre-charge period and charging the voltage of the third terminal Ti3 to the positive reference voltage Vpu side in advance. As described above, in the semiconductor device 1 according to the first embodiment, the magnitude of the input voltage Vin to be measured largely varies between the positive conversion phase and the negative conversion phase. When the first pre-charge period is not provided, the time required to settle the input voltage Vin to the target voltage Vtgt tends to be long. For this reason, the time reduction of the conversion phases by providing the first pre-charge periods as in semiconductor device 1 of the first embodiment greatly contributes to the reduction of the time required for one conversion cycle.

Further, in the semiconductor device 1 according to the first embodiment, the reference voltages given as the first reference voltage V1 and the second reference voltage V2 are interchanged between the positive conversion phase and the negative conversion phase, and the resistance value of the sensor resistance Rth is obtained based on the mean value of the output data Do obtained in the positive conversion phase and the negative conversion phase, thereby making it possible to cancel errors such as offsets included in the system.

In the semiconductor device 1 according to the first embodiment, the decoder 27 is provided in the ΔΣ-ADC 14 to prevent the breakdown of the operation of the ΔΣ-ADC 14 due to the switching of the reference voltages. In addition, the decoder can reduce the circuit size and maintain the converting accuracy with high accuracy as compared with a configuration in which, for example, an analog switch circuit is used to invert the reference voltages to be applied to the DAC 28. In the analog switch configuration, the reference voltage is transmitted to the DAC 28 through the analog switch, but an error occurs due to the on-resistance of the analog switch. Further, in the analog switch configuration, a problem arisen from an influence of a voltage convergence time at switching of the reference voltage by the analog switch must be considered. Further, in the analog switch configuration, in order to reduce the on-resistance of a transistor, design considerations such as increasing the element size are required. However, since the decoder 27 can be configured with only one logic circuit, for example, the exclusive OR circuit in FIG. 4, all the problems occurring in the analog switch configuration can be solved.

In the semiconductor device 1 according to the first embodiment, the reference voltage inputted to the ΔΣ-ADC 14 and the reference voltage applied to the sensor resistor Rth are supplied from the same voltage source. As a result, it is possible to further reduce the error of the output data Do without causing the error generated at the conversion.

In other words, in the semiconductor device 1 according to the first embodiment, by providing the positive conversion phase and the negative conversion phase in one conversion cycle and averaging the output values obtained in the respective conversion phases, it is possible to measure the resistance value with high accuracy and in a wide measurement range.

Second Embodiment

In a second embodiment, the semiconductor device 2, which is the modified example of the semiconductor device 1 according to the first embodiment, will be described. In the description of the second embodiment, the same components as those of the first embodiment are denoted by the same reference numerals as those of the first embodiment, and description thereof is omitted.

Figure 9:
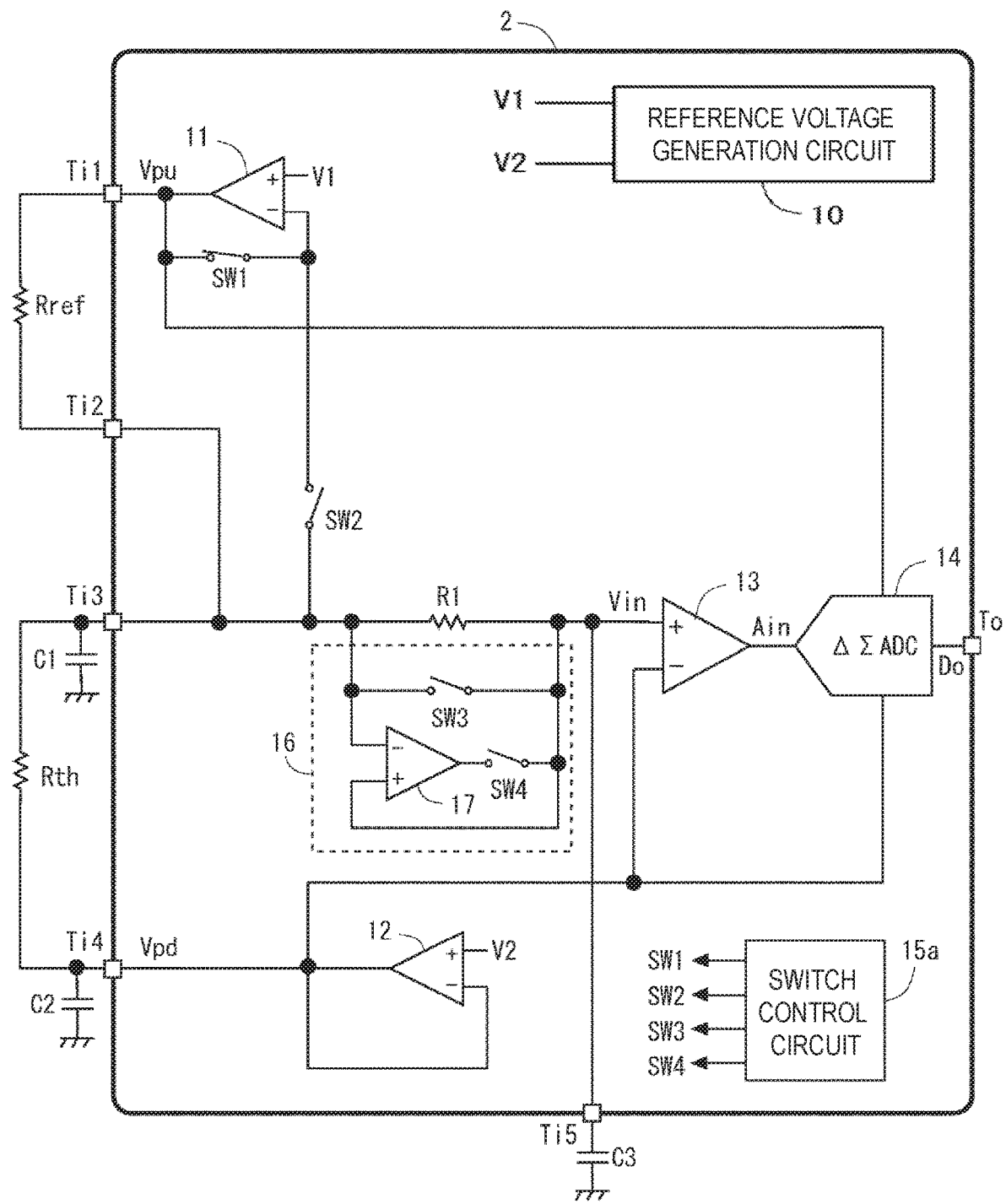
FIG. 9 is a diagram of a semiconductor device in a second embodiment.

FIG. 9 shows a block diagram of the semiconductor device 2 according to the second embodiment. As shown in FIG. 9, the semiconductor device 2 according to the second embodiment is obtained by adding an input resistor R1, a bypass circuit 16, and a fifth terminal Ti5 to the semiconductor device 1 according to the first embodiment. A third capacitor C3 is connected to the fifth terminal Ti5. The third capacitor C3 is connected to the non-inverting terminal of the pre-buffer 13 via the fifth terminal Ti5. In the semiconductor device 2 according to the second embodiment, an EMI noise of the input line to which the input voltage Vin is transmitted by the resistor R1 and the third capacitor C3 is reduced.

The input resistor R1 is inserted into an input wire connecting the third terminal Ti3 and the non-inverting terminal of the pre-buffer 13. The bypass circuit 16 is provided in parallel with the input resistor R1. The bypass circuit 16 forms a path for temporarily bypassing the input resistor R1.

Here, the bypass circuit 16 includes a third switch (e.g., a switch SW3, a fourth switch (e.g., a switch SW4), and an operational amplifier 17, wherein the switch SW3 and the switch SW4 are controlled to be opened and closed by the switch control circuit 15a, and the switch control circuit 15a has a function of controlling the switches SW3 and SW4 added to the switch control circuit 15.

The switch SW3 is connected in parallel with the input resistor. The operational amplifier 17 has an inverting terminal connected to a node between the third terminal Ti3 and the input resistor R1, and a non-inverting terminal connected to a node between the pre-buffer 13 and the input resistor R1. The switch SW4 is connected between the output terminal of the operational amplifier 17 and the non-inverting terminal of the operational amplifier 17.

Here, in the semiconductor device 2 according to the second embodiment, the addition of the third capacitor C3 may increase a settling time for the input voltage Vin, which is a time to set the input voltage Vin before the analog-to-digital converting process is performed, to the target voltage Vtgt. However, in the semiconductor device 2 according to the second embodiment, by providing the bypass circuit 16, the time required for setting the input voltage Vin to the target voltage Vtgt is shortened. The operation of the semiconductor device 2 according to the second embodiment will be described below. Since the positive conversion phase and the negative conversion phase are provided also in the semiconductor device 2 according to the second embodiment, the operation of the semiconductor device 2 will be described for each conversion phase in the following explanation.

Figure 10:
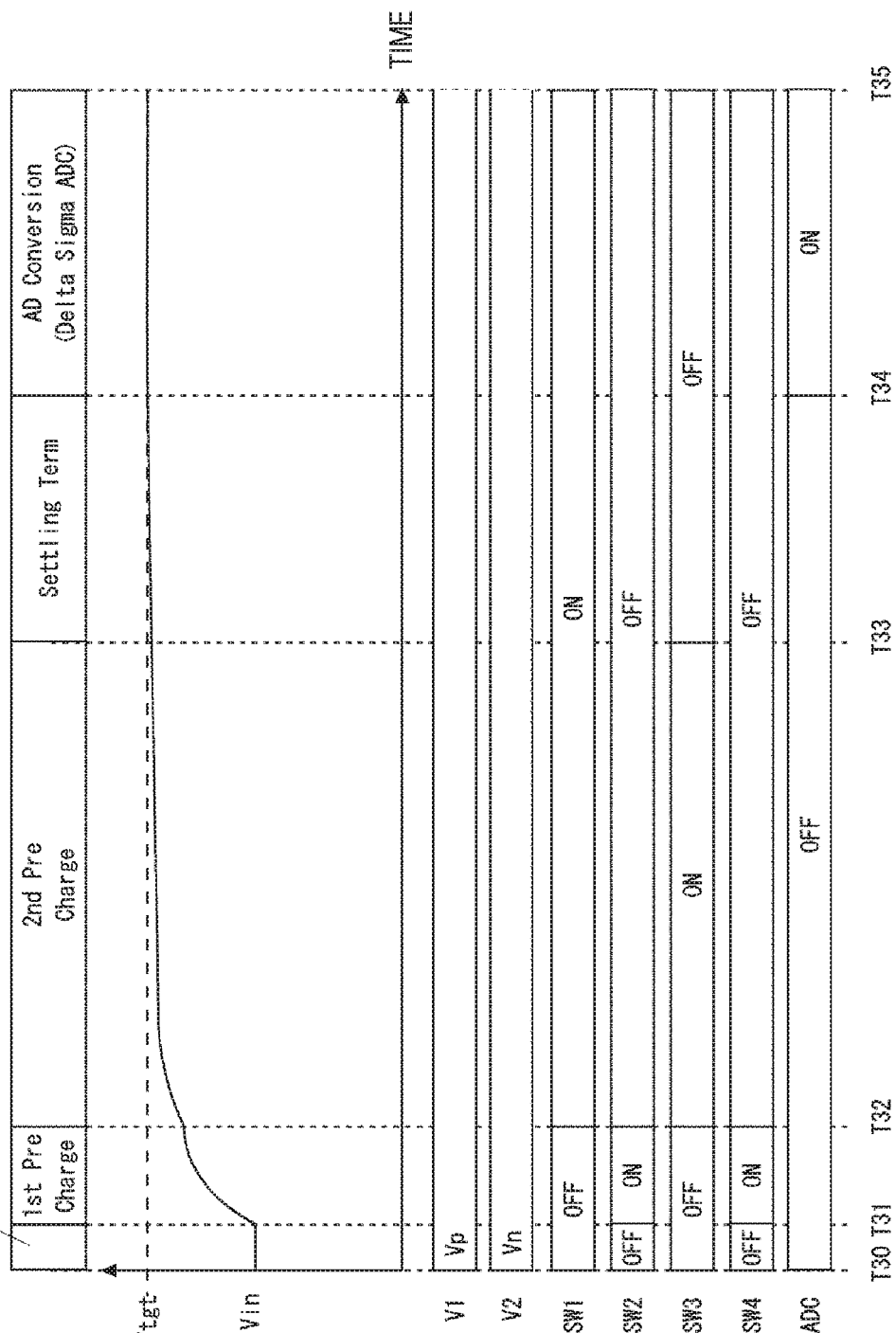
FIG. 10 is a timing chart showing a positive conversion phase of the semiconductor device in the second embodiment.

FIG. 10 is a timing chart for explaining the operation of the positive conversion phase of the semiconductor device according to the second embodiment. As shown in FIG. 10, in the positive transformation phase, first, during the phase switching period from time T30 to time T31, the first reference voltage V1 and the second reference voltage V2 to be output is set. Specifically, in the positive conversion phase, the high potential side reference voltage Vp is output as the first reference voltage V1, and the low potential side reference voltage Vn is output as the second reference voltage V2.

Subsequently, the semiconductor device 2 turns off the switches SW1 and SW3, and turns on the switches SW2 and SW4 in the first pre-charge period from the timing T31 to the timing T32. As a result, the operational amplifier 11 operates to pull up the voltage on the third terminal Ti3 side of the sensor resistor Rth, i.e., the voltage of the input line, to the high potential side reference voltage Vp side. In second embodiment, the operational amplifier 17 charges the third capacitor C3 during the first pre-charge period.

Subsequently, in the second pre-charge period from the timing T32 to the timing T33, the semiconductor device 2 switches on the switches SW1 and SW3, and switches off the switches SW2 and SW4. As a result, the semiconductor device 2 sets the input voltage Vin to the target voltage Vtgt corresponding to the resistance of the sensor resistor Rth while the high potential side reference voltage Vp is applied to one end of the reference resistor Rref by the operational amplifier 11 and the low potential side reference voltage Vn is applied to the other end of the sensor resistor Rth by the operational amplifier 12. Further, in the second pre-charge period, since the switch SW3 forms a path for bypassing the input resistor R1, charging the third capacitor C3 by the operational amplifier 11 is promoted, and the slowness of the voltage rise rate of the input voltage Vin is reduced.

Subsequently, the semiconductor device 2 switches on the switch SW1, and switches off the switches SW2, the SW3, and the SW4 in the settling period from the timing T33 to the timing T34. As a result, the semiconductor device 2 regulates the input voltage Vin to the target voltage Vtgt corresponding to the resistance value of the sensor resistor Rth while the high potential side reference voltage Vp is supplied to one end of the reference resistor Rref by the operational amplifier 11 and the low potential side reference voltage Vn is supplied to the other end of the sensor resistor Rth by the operational amplifier 12. In the settling period, the input resistor R1 effectively functions.

Subsequently, in the analog-to-digital conversion processing period from the timing T34 to the timing T35, the semiconductor device 2 performs the analog-to-digital conversion processing on the input voltage Vin in a state in which the states of the switches SW1, the SW2, the SW3, and the SW4 are maintained to be the same as in the settling period.

Figure 11:
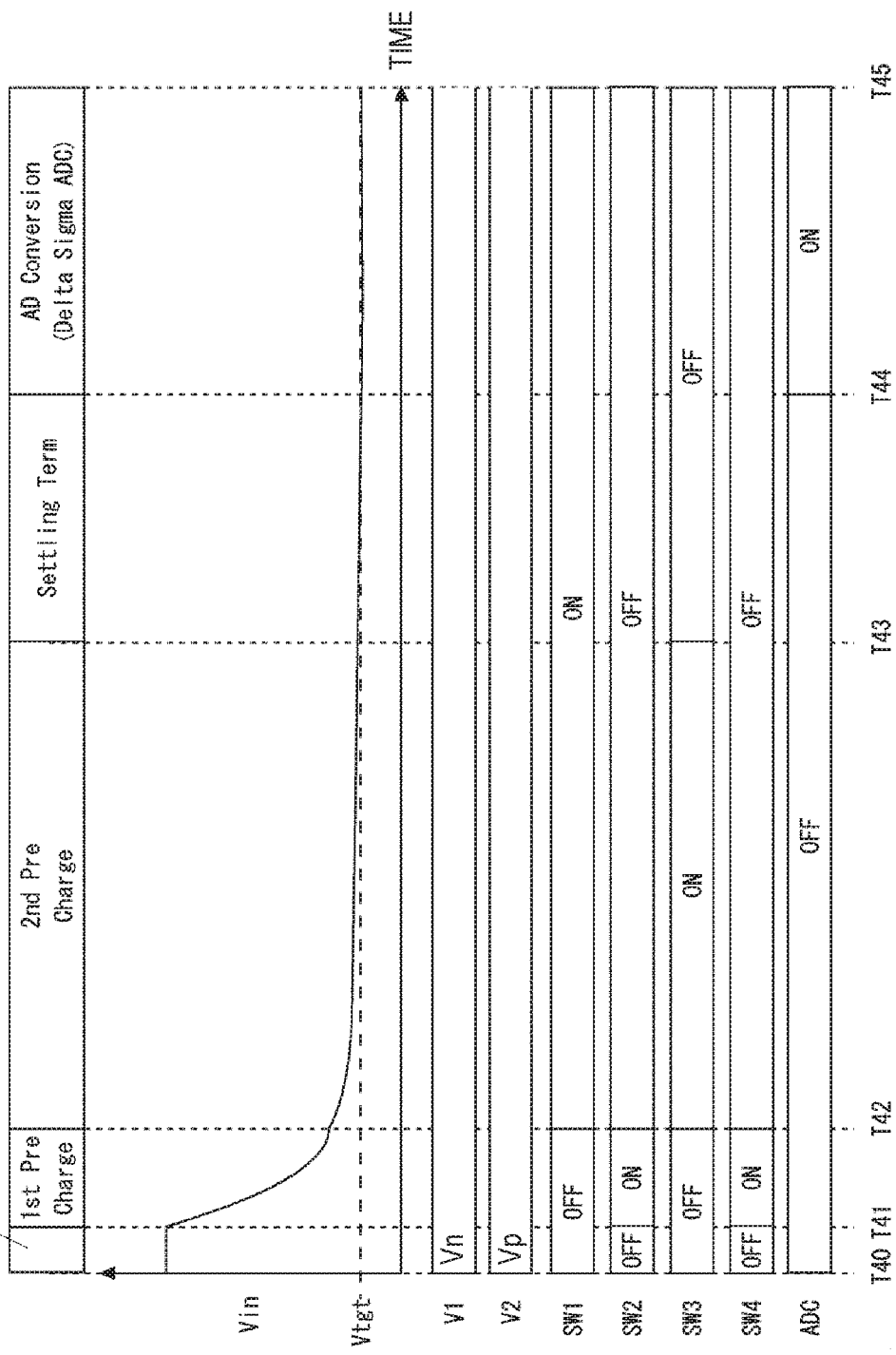
FIG. 11 is a timing chart showing a negative conversion phase of the semiconductor device in the second embodiment.

Next, FIG. 11 is a timing chart for explaining the operation of the negative conversion phase of the semiconductor device according to the second embodiment. As shown in FIG. 11, in the negative transformation phase, first, during the phase switching period from time T40 to time T41, the first reference voltage V1 and the second reference voltage V2 to be output is set. Specifically, in the negative conversion phase, the low potential side reference voltage Vn is output as the first reference voltage V1, and the high potential side reference voltage Vp is output as the second reference voltage V2.

Subsequently, the semiconductor device 2 turns off the switches SW1 and SW3, and turns on the switches SW2 and SW4 in the first pre-charge periods from the timing T41 to the timing T42. As a result, the operational amplifier 11 operates to pull down the voltage on the third terminal Ti3 side of the sensor resistor Rth, that is, the voltage of the input line, to the low potential side reference voltage Vn side. In second embodiment, the operational amplifier 17 discharges from the third capacitor C3 during the first pre-charge period.

Subsequently, the semiconductor device 2 switches on the switches SW1 and SW3, and switches off the switches SW2 and SW4 in the second precharge periods from the timing T42 to the timing T43. As a result, the semiconductor device 2 sets the input voltage Vin to the target voltage Vtgt corresponding to the resistance of the sensor resistor Rth while the low potential side reference voltage Vn is applied to one end of the reference resistor Rref by the operational amplifier 11 and the high potential side reference voltage Vp is applied to the other end of the sensor resistor Rth by the operational amplifier 12. Further, in the second pre-charge period, since the switch SW3 forms a path for bypassing the input resistor R1, discharging the third capacitor C3 by the operational amplifier 11 is accelerated, and the slowdown of the voltage drop rate of the input voltage Vin is reduced.

Subsequently, the semiconductor device 2 switches on the switch SW1, and switches off the switches SW2, the SW3, and the SW4 in the settling periods from the timing T43 to the timing T44. As a result, the semiconductor device 2 regulates the input voltage Vin to the target voltage Vtgt corresponding to the resistance value of the sensor resistor Rth while the low potential side reference voltage Vn is supplied to one end of the reference resistor Rref by the operational amplifier 11 and the high potential side reference voltage Vp is supplied to the other end of the sensor resistor Rth by the operational amplifier 12. In the settling period, the input resistor R1 effectively functions.

Subsequently, in the analog-to-digital conversion processing period from the timing T44 to the timing T45, the semiconductor device 2 performs the analog-to-digital conversion processing on the input voltage Vin while maintaining the states of the switches SW1, the SW2, the SW3, and the SW4 in the same manner as in the settling period.

As described above, in the semiconductor device 2 according to the second embodiment, by providing the third capacitor C3 as an external component, the resistance to EMI noise is improved. By providing the bypass circuit 16, an extended time required to settle the input voltage Vin to the target voltage Vtgt due to the addition of the third capacitor C3 is suppressed, thereby shortening the conversion-cycle time.

Third Embodiment

In a third embodiment, the semiconductor device 3 as the modified example of the semiconductor device 2 according to the second embodiment will be described. In the description of the third embodiment, the same components as those of first embodiment and 2 are denoted by the same reference numerals as those of first embodiment and 2, and description thereof is omitted.

Figure 12:
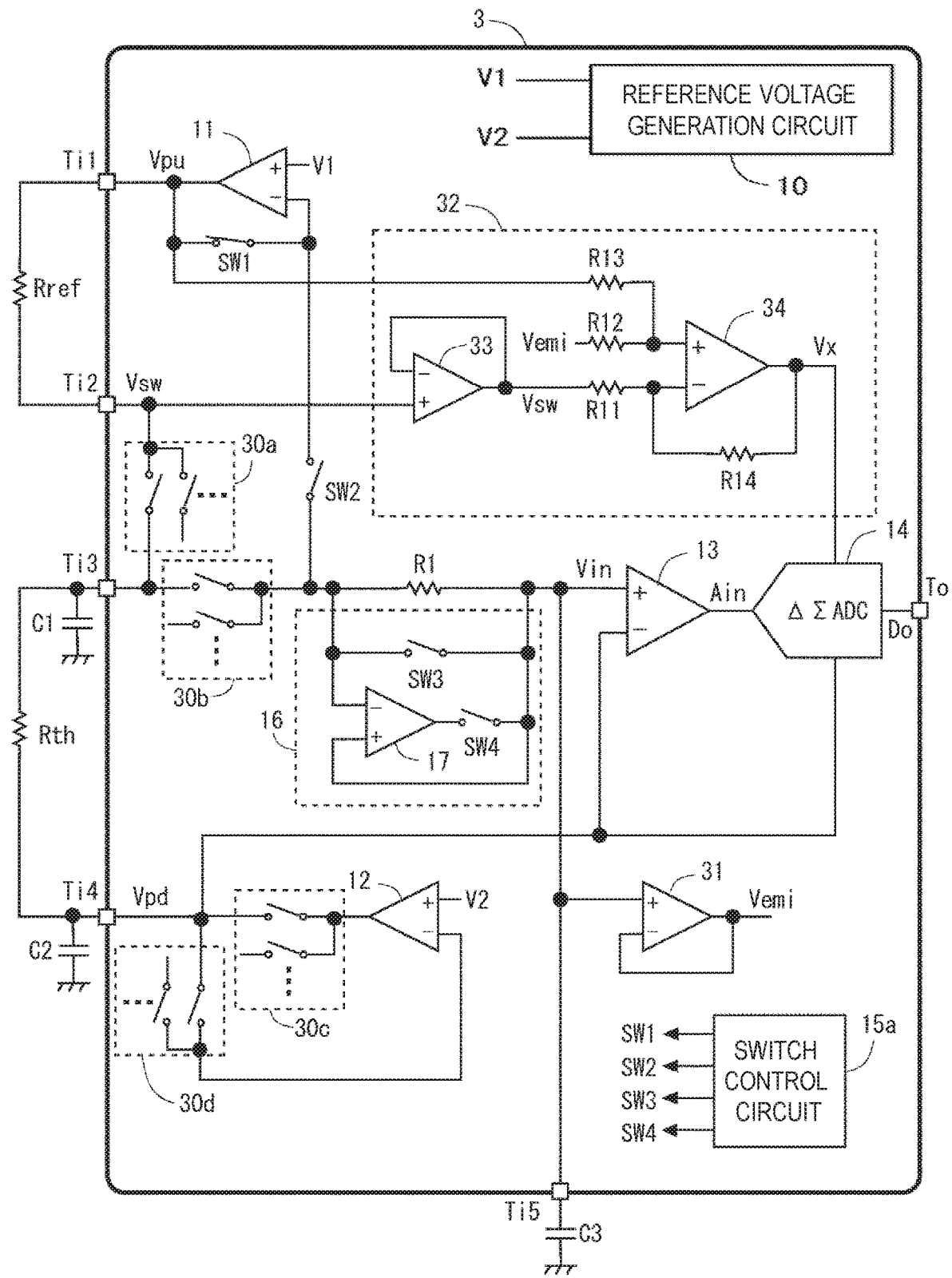
FIG. 12 is a diagram of a semiconductor device in a third embodiment.

FIG. 12 shows a block diagram of the semiconductor device 3 according to the third embodiment. In the semiconductor device 3 according to the third embodiment, although not shown in FIG. 12, a plurality of resistive components corresponding to the sensor resistance Rth are connected as external components. The semiconductor device 3 according to the third embodiment selects one of a plurality of resistive components in a time division manner, and measures the resistance value of the selected resistive component. Although not shown in FIG. 12, the semiconductor device 3 has a plurality of sets of third terminal Ti3 and fourth terminal Ti4 corresponding to a plurality of resistive components.

As shown in FIG. 12, the semiconductor device 3 according to the third embodiment is obtained by adding multiplexers 30a to 30d, buffer 31, and subtractor 32 to the semiconductor device 2 according to the second embodiment. The multiplexers 30a to 30d select any one of a plurality of resistive components provided outside.

Specifically, the multiplexer 30a is provided on a wire connecting the second terminal Ti2 and the third terminal Ti3. The multiplexer 30b is provided on a wire connecting the third terminal Ti3 and the pre-buffer 13. The multiplexer 30c is provided between the output terminal of the operational amplifier 12 and the fourth terminal Ti4. The multiplexer 30d is provided on a feedback line connecting the inverting terminal of the operational amplifier 12 and the fourth terminal Ti4.

The selection of the sensor resistance Rth by the multiplexers 30a to 30d is performed in the period of the timing T10 to T11 in FIG. 6 or the timing T30 to T31 in FIG. 10.

The buffer 31 is a buffer circuit for transmitting the input voltage Vin to the subtraction circuit 32. The subtraction circuit 32 subtractors an error voltage caused by the on-resistance of the multiplexers 30a to 30d from the first reference voltage V1, for example, the positive reference voltage Vpu output from the operational amplifier 11, to generate a third reference voltage Vx, and supplies the third reference voltage Vx to the ΔΣ-ADC 14 in place of the positive reference voltage Vpu.

Here, the subtraction circuit 32 includes a buffer 33, an operational amplifier 34, and resistors R11 to R14. The buffer 33 applies the voltage Vsw generated at the second terminal Ti2 to one end of the resistor R11. The other end of the resistor R11 is connected to an inverting terminal of the operational amplifier 34. The resistor R14 is provided between the inverting terminal and the output terminal of the operational amplifier 34. One end of the resistor R12 is supplied with the voltage Vemi outputted from the buffer 31, and the other end of the resistor R12 is connected to the non-inverting terminal of the operational amplifier 34. The resistor R13 has one end supplied with the positive reference voltage Vpu output from the operational amplifier 11, and the other end connected to the non-inverting terminal of the operational amplifier 34. The operational amplifier 34 outputs the third reference voltage Vx.

Here, the third reference voltage Vx output from the subtraction circuit 32 will be described. First, the voltage Vemi corresponding to the input voltage Vin of the semiconductor device 3 is expressed by Equation (3) where the error voltage caused by the multiplexers 30a to 30d is Verror and the voltage of the second terminal Ti2 is Vsw.

[Equation 3]

$$Vemi = Vsw + Verror \quad (3)$$

The third reference voltage is generated in the subtraction circuit 32 based on Equation (4).

[Equation 4]

$$\begin{aligned} Vx &= Vpu + Vsw - Vemi \\ &= Vpu + Vsw - (Vsw + Verror) \\ &= Vpu - Verror \end{aligned} \quad (4)$$

As described above, by subtracting the error voltage Verror from one of the reference voltages applied to the ΔΣADC 14, the error voltage superimposed on the input voltage Vin is canceled in the operation of the ΔΣADC 14, and the effect of the error voltage Verror can be removed from the output data Do to be finally output.

As described above, in the semiconductor device 3 according to the third embodiment, the detected signals from a plurality of resistive components (e.g., a plurality of sensors) can be converted into digital values by one semiconductor device. At this time, the semiconductor device 3 according to the third embodiment cancels the error voltages caused by the multiplexers 30a to 30d by using the buffers 31 and the subtractors 32. As a result, in the semiconductor device 3 according to the third embodiment, the resistance values of a plurality of resistive components can be obtained with high accuracy and at high speed.

Fourth Embodiment

In a fourth embodiment, the ΔΣADC 14a serving as the modified example of the ΔΣADC 14 according to the first embodiment will be described. In the fourth embodiment description, the same components as those described in first embodiment are denoted by the same reference numerals as in first embodiment, and description thereof is omitted.

Figure 13:
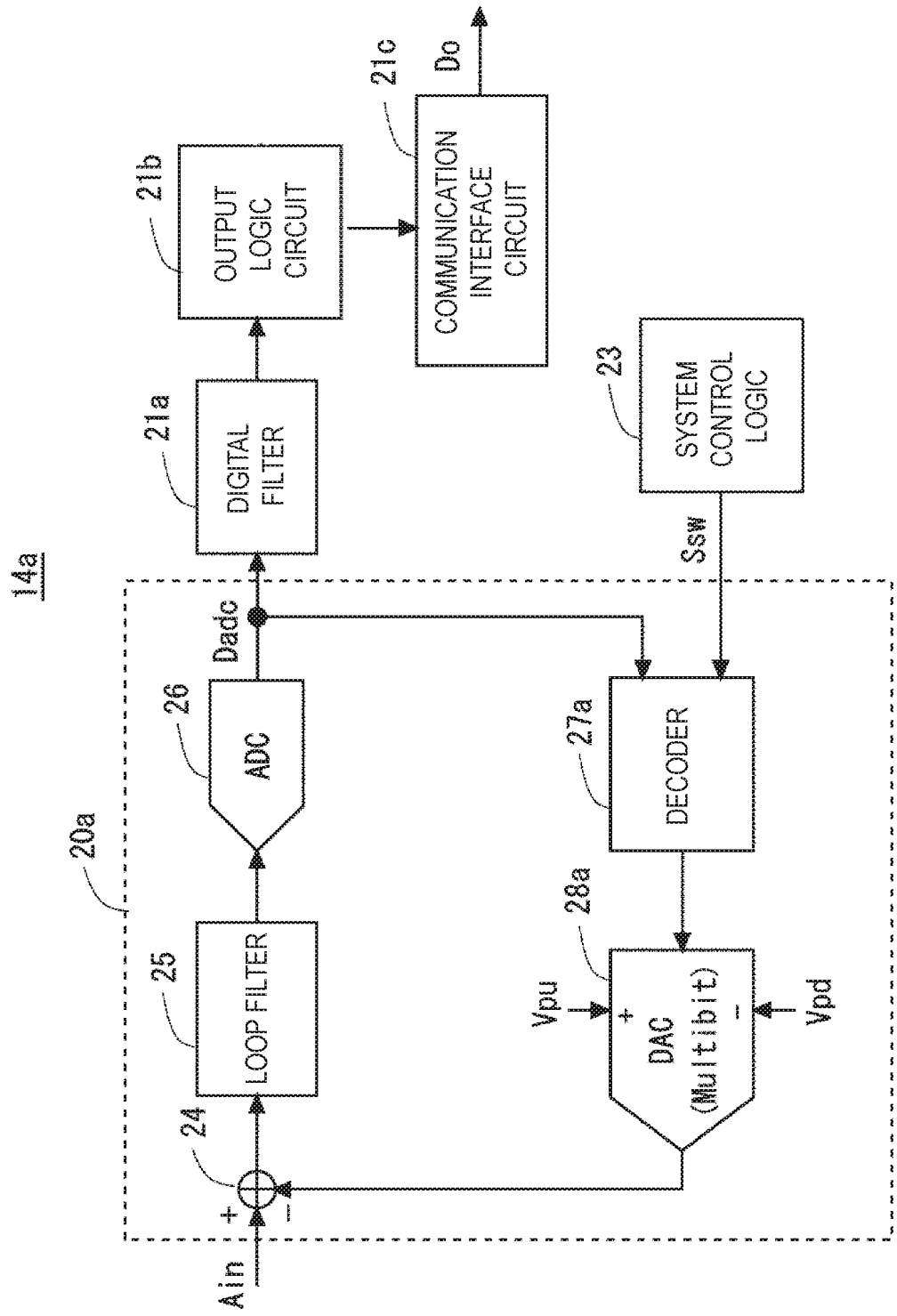
FIG. 13 is a block diagram of the A analog-to-digital converter circuit of the semiconductor device in the fourth embodiment.

FIG. 13 shows a block diagram of the ΔΣADC 14a of the semiconductor device according to the fourth embodiment. As shown in FIG. 13, the ΔΣADC 14a is obtained by replacing the decoder 27 and the DAC 28 of the ΔΣADC 14a shown in FIG. 3 with the decoder 27a and the DAC 28a. The DAC 28a is a multi-bit DAC that generates a feedback signal based on a multi-bit, e.g., 2-bit, feedback digital value. Therefore, the decoder 27a has a function of decoding a multi-bit feedback digital signal. Therefore, the decode rule of the decoder 27a will be described.

Figure 14:
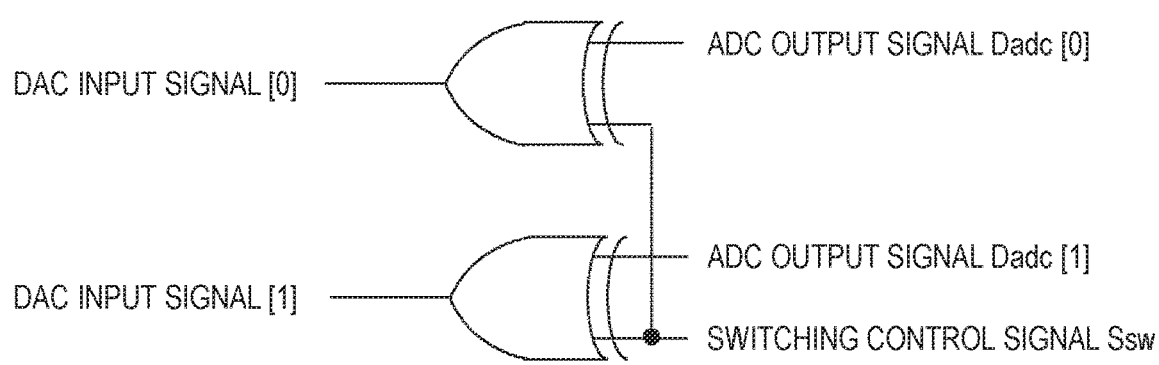
FIG. 14 is a circuit diagram showing an example of a table for explaining a decode rule and a circuit example of the decoder in the fourth embodiment.

FIG. 14 is a table for explaining the operation rules of the decoder 27a according to the fourth embodiment and an exemplary circuit diagram of the decoder 27a. As shown in FIG. 14, the decoder 27a also has a first decoding rule when the value of the switching control signal Ssw is 0 and a second decoding rule when the value of the switching control signal Ssw is 1. In the first decode rule, the output signal Dadc of the analog-to-digital converter 26 and the output value of the decoder 27 have the same value. On the other hand, in the second decode rule, the output value of the decoder 27 is inverted with respect to the output signal Dadc of the analog-to-digital converter 26. The operation of the table shown in FIG. 14 can be realized by, for example, two exclusive OR circuits. In this case, the switching control signal Ssw is input to one input terminal of each of the exclusive OR circuits. The bit-0 signal of the analog-digital conversion circuit 26 is input to the other input terminal of one of the exclusive OR circuits, the bit-1 signal of the analog-digital conversion circuit 26 is input to the other input terminal of the other exclusive OR circuit.

As described above, the ΔΣADC 14a according to the fourth embodiment can operate without breaking the operation of the ΔΣADC 14a by the multi-bit decoder 27a even when the DAC 28a is used and the reference voltages are switched.

Fifth Embodiment

In a fifth embodiment, the ΔΣADC 14b serving as the modified example of the ΔΣADC 14 according to the first embodiment will be described. In the fifth embodiment description, the same components as those described in first embodiment are denoted by the same reference numerals as in first embodiment, and description thereof is omitted.

Figure 15:
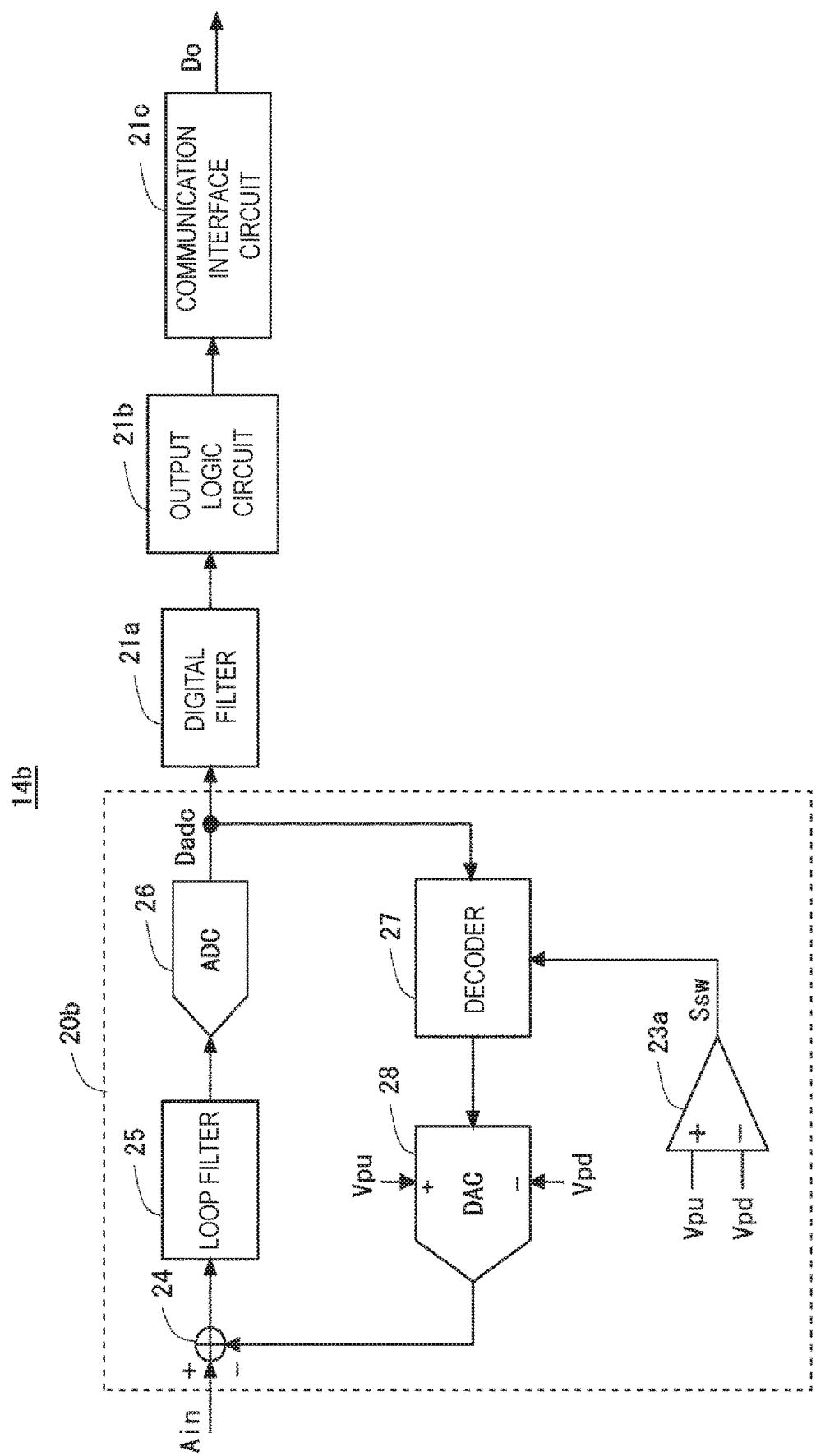
FIG. 15 is a block diagram of a $\Delta\Sigma$ analog-to-digital converter circuit of a semiconductor device in a fifth embodiment.

FIG. 15 shows a block diagram of the ΔΣADC 14b of the semiconductor device according to the fifth embodiment. As shown in FIG. 15, the ΔΣADC 14b has a comparator 23a instead of the system control logic 23. In the ΔΣADC 14b, the comparator 23a and the decoder 27 are used as operation control circuits. The comparator 23a switches the logic level of the switching control signal Ssw to be output in accordance with the magnitude relationship between the first reference voltage V1 (for example, the positive reference voltage Vpu) and the second reference voltage V2 (for example, the negative reference voltage Vpd). That is, the comparator 23a is realized by an analog circuit that performs the same operation as the system control logic 23.

In the ΔΣADC 14b according to the fifth embodiment, it has been described that the system control logic 23 can be realized by an analog circuit such as the comparators 23a. In addition, by providing the comparator 23a as a part of the operation control circuit, the operation of the ΔΣADC 14b can be maintained without a signal indicating switching of the conversion phase from an upper system. The DAC 28 shown in FIG. 15 may be either a 1-bit DAC or a multi-bit DAC.

Sixth Embodiment

In a sixth embodiment, ΔΣADC 14c serving as the modified example of the ΔΣADC 14 will be described. In the sixth embodiment, for example, the semiconductor device 1 is configured using a discrete ΔΣADC that does not include the decoder 27. In the description of the sixth embodiment, the same constituent elements as those described in the first embodiment are denoted by the same reference numerals as those of the first embodiment, and description thereof is omitted.

Figure 16:
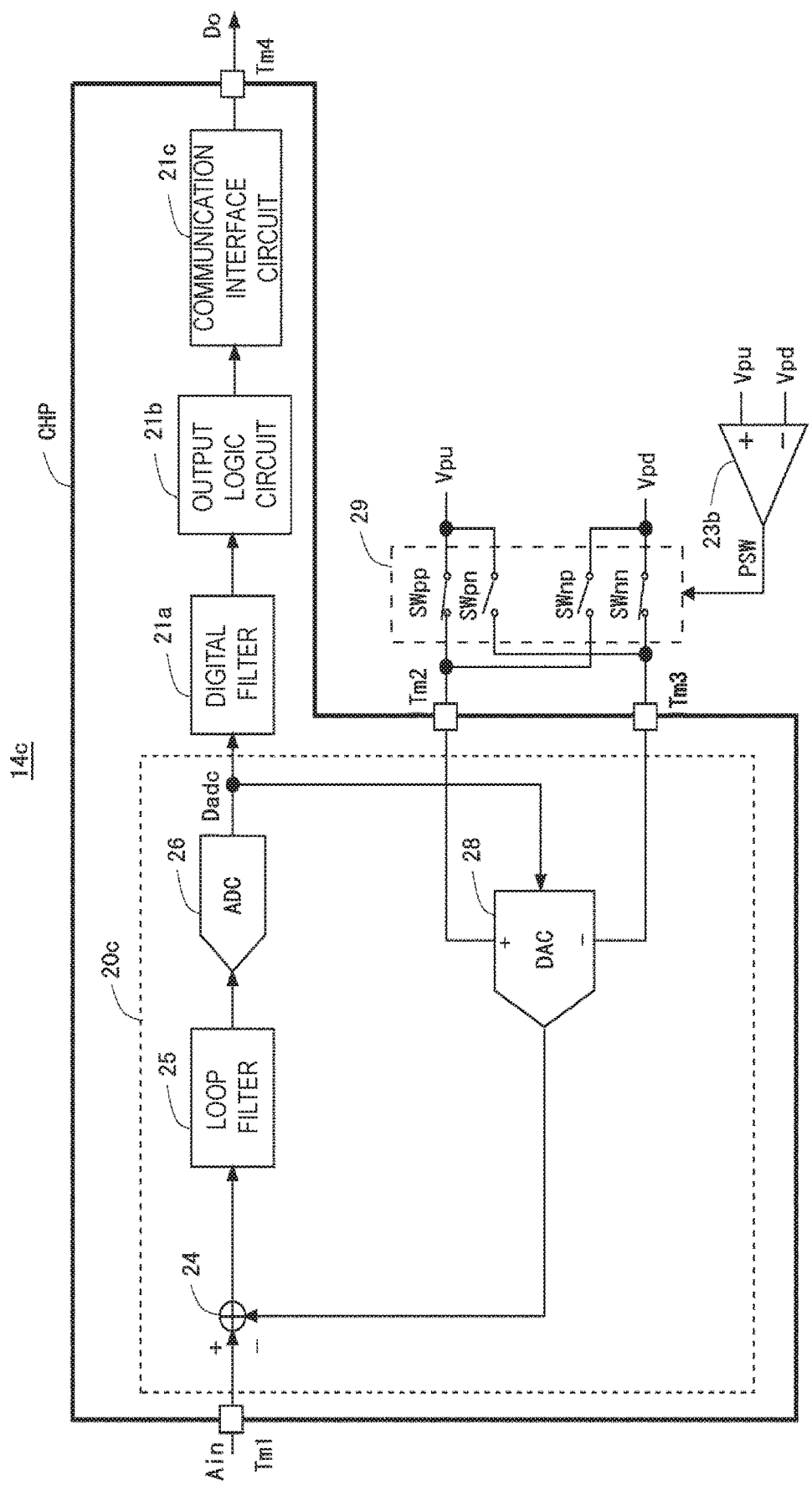
FIG. 16 is a block diagram of a ΔΣ analog-to-digital converter circuit of a semiconductor device in a sixth embodiment.

FIG. 16 shows a block diagram of the ΔΣADC 14b of the semiconductor device according to the sixth embodiment. As shown in FIG. 16, in the ΔΣADC 14c, the reference voltage switching circuit 29 and the comparator 23b are connected to the ΔΣADC chip (CHP). The ΔΣADC chip (CHP) is equipped with a configuration excluding the decoder 27 and the system control logic 23 from the ΔΣADC 14. The ΔΣADC chip (CHP) is connected to other components provided outside via a terminals Tm1 to Tm4. The reference voltage switching circuit 29 is an operation control circuit, and switches between connecting the positive reference voltage Vpu to the positive reference voltage input terminal of the DAC 28 (e.g., terminal Tm2) and connecting the Vpu to the negative reference voltage input terminal of the DAC 28 (e.g., terminal Tm3) in accordance with the output signal of the comparator 23b. The reference voltage switching circuit 29 also switches between connecting the negative reference voltage Vpd to the positive reference voltage input terminal of the DAC 28 and connecting the Vpd to the negative reference voltage input terminal of the DAC 28 in accordance with the output signal of the comparator 23b. The ΔΣADC 14c includes the comparator 23b instead of the system control logic 23. The comparator 23b is the same as the comparator 23a described with reference to FIG. 15.

The reference voltage switching circuits 29 include switches SWpp and SWpn, and SWnp and SWnn. The switch SWpp is a switch between the positive reference voltage Vpu and the positive reference voltage input terminal of the DAC 28. The switch SWpn is a switch between the positive reference voltage Vpu and the negative reference voltage input terminal of the DAC 28. The switch SWnp is a switch between the negative reference voltage Vpd and the positive reference voltage input terminal of the DAC 28. The switch SWnn is a switch between the negative reference voltage Vpd and the negative reference voltage input terminal of the DAC 28.

When the switching control signal Ssw outputted from the comparator 23b indicates the positive conversion phase, the reference voltage switching circuit 29 turns on the switches SWpp and SWnn, and turns off the switches SWpn and SWnp. On the other hand, when the switching control signal Ssw outputted from the comparator 23b indicates the negative conversion phase, the reference voltage switching circuit 29 turns off the switches SWpp and SWnn, and turns on the switches SWpn and SWnp.

In the ΔΣADC 14c according to the sixth embodiment, it has been described that even when a discrete component without the decoder 27 is used as the ΔΣADC, the semiconductor device 1 can be operated without breaking the operation of the ΔΣADC 14c by using the reference voltage switching circuit 29 and the comparator 23b as external components. Instead of the comparator 23b, the system control logic 23 may be used.

Although the invention made by the inventor has been specifically described based on the embodiment, the present invention is not limited to the embodiment already described, and it is needless to say that various modifications can be made without departing from the gist thereof.

(Additional statement 1) A sensor system circuit for converting an analog signal obtained from a resistive component into output data composed of a digital value while periodically switching a magnitude relationship between a first reference voltage and a second reference voltage to be applied to the resistive component to be measured, the analog-to-digital conversion circuit for converting the analog signal into the output data, the adder for adding the analog signal and the feedback signal, a loop filtering for smoothing an output of the adder, the digital-to-analog conversion unit for converting an output signal of the loop filtering into a digital output value, the digital-to-analog conversion circuit for converting the digital output value into an analog value by referring to the first reference voltage and the second reference voltage to generate the feedback signal, the operation control circuit for maintaining the correspondence relationship between the digital output value and the analog value of the feedback signal regardless of the magnitude relationship between the first reference voltage and the second reference voltage, and the operation control circuit for maintaining the correspondence relationship between the digital output value and the analog value of the feedback signal in the same manner An analog-to-digital conversion circuit comprising:

(Additional statement 2) The analog-to-digital conversion circuit according to additional statement 1, claim, when a period in which a high-potential-side reference voltage is applied as the first reference voltage, a low-potential-side reference voltage is applied as the first conversion phase, and a period in which the low-potential-side reference voltage is applied as the first reference voltage, and the high-potential-side reference voltage is applied as the second reference voltage is set as the second conversion phase, a first decode rule used in a period of the first conversion phase, and a second decode rule used in a period of the second conversion phase, which outputs a feedback digital value obtained by decoding the digital output value in place of the digital output value, and wherein the operation control circuit outputs a control signal indicating a type of a conversion phase to the decoder in accordance with a difference between the first conversion phase and the second conversion phase.

(Additional statement 3) The analog-to-digital conversion circuit according to additional statement 1, wherein the digital-to-analog conversion circuit generates the feedback signal based on the digital output value composed of a plurality of bit values.

(Additional statement 4) The analog-to-digital conversion circuit according to additional statement 1, claim, when a period in which a high-potential-side reference voltage is applied as the first reference voltage, a low-potential-side reference voltage is applied as the first conversion phase, a period in which the low-potential-side reference voltage is applied as the second reference voltage, and a period in which the high-potential-side reference voltage is applied as the second reference voltage is set as the second conversion phase, the operation control circuit switches a path for transmitting the first reference voltage and the second reference voltage to the digital-to-analog conversion circuit based on a magnitude relationship between the first reference voltage and the second reference voltage so that a voltage value does not change in a magnitude relationship between a reference voltage applied to the digital-to-to-analog conversion circuit in either of the first conversion phase and the second conversion phase.

(Additional statement 5) The analog-to-digital converter circuit according to additional statement 1, further comprising: a digital filtering for performing a filtering process on the digital output value; and an output logic circuit for generating output data including a digital code corresponding to a magnitude of an analog value of the analog signal based on the digital output value processed by the digital filtering.

(Additional statement 6) The analog-to-digital conversion circuit according to additional statement 5, further comprising: an arithmetic circuit for calculating a resistance value of the sensor resistor based on an average value of first output data output in the first conversion phase and second output data output in the second conversion phase, when a period in which a high-potential-side reference voltage is applied as the first reference voltage, a period in which a low-potential-side reference voltage is applied as the second reference voltage is applied as the first conversion phase, and a period in which the high-potential-side reference voltage is applied as the second reference voltage is the second conversion phase.

What is claimed is:
1. A semiconductor device comprising:
   a first terminal configured to couple to one end of a reference resistor;
   a second terminal configured to couple to the other end of the reference resistor;
   a third terminal configured to couple to the second terminal, one end of a sensor resistor and a first capacitor;
   a fourth terminal configured to couple to the other end of the sensor resistor and a second capacitor;
   a first buffer that outputs a first reference voltage to the first terminal;
   a second buffer that outputs a second reference voltage to the fourth terminal;
   a pre-buffer that amplifies an input voltage via the third terminal to generate an analog signal; and
   an analog-to-digital conversion circuit that converts the analog signal to digital data using the first reference voltage and the second reference voltage and outputs output data including the digital data,
   wherein one of a high potential reference voltage and a low potential reference voltage is selected as the first reference voltage in a time division manner,
   wherein the other of the high potential reference voltage and the low potential reference voltage is selected as the second reference voltage in a time division manner,
   wherein the analog-to-digital conversion circuit outputs first output data obtained in a first conversion phase in which the high potential reference voltage is supplied as the first reference voltage and the low potential reference voltage is supplied as the second reference voltage, and second output data obtained in a second conversion phase in which the low potential reference voltage is supplied as the first reference voltage and the high potential reference voltage is supplied as the second reference voltage as the output data, and
   wherein the first output data and the second output data are used for calculating a resistance value of the sensor resistor.

2. The semiconductor device according to claim 1, further comprising:
   a first switch disposed between an inverting terminal and an output terminal of the first buffer;
   a second switch disposed between an inverting terminal of the first buffer and the third terminal; and
   a switch control circuit that controls the first switch and the second switch,
   wherein the first switch is turned off and the second switch is turned on by the switch control circuit during a first pre-charge period after voltages provided as the first reference voltage and the second reference voltage are changed, and
   wherein the first switch is turned on and the second switch is turned off by the switch control circuit after the first pre-charge period.

3. The semiconductor device according to claim 1, further comprising:
   a reference voltage generation circuit that generates the high potential reference voltage and the low potential reference voltage.

4. The semiconductor device according to claim 2, further comprising:
   an input resistor disposed between the third terminal and the pre-buffer;
   a fifth terminal configured to couple to a node between the input resistor and the pre-buffer and a third capacitor; and a bypass circuit that bypasses the input resistor,
the bypass circuit comprising:
a third switch disposed in parallel to the input resistor;
an operational amplifier having an inverting terminal coupled to the third terminal and a non-inverting terminal connected to the node; and
a fourth switch disposed between an output terminal of the operational amplifier and the node,
wherein the third switch is turned off and the fourth switch is turned on by the switch control circuit during the first pre-charge period,
wherein the first and third switches are turned on and the second and fourth switches are turned off by the switch control circuit during a second pre-charge period after the first pre-charge period, and
wherein the first switch is turned on and the second, third and fourth switches are turned off by the switch control circuit after the second pre-charge period.

5. The semiconductor device according to claim 1, further comprising:
a multiplexer,
wherein the sensor resistor includes a plurality of sensor resistors,
wherein the third terminal includes a plurality of third terminals,
wherein the fourth terminal includes a plurality of fourth terminals, and
wherein the multiplexer selects one of the plurality of sensor registers in a time division manner.

6. The semiconductor device according to claim 5, further comprising a subtractor circuit that subtracts an error voltage caused by an on-resistance of the multiplexer from the first reference voltage to generate a third reference voltage and providing the third reference voltage to the analog-to-digital converter circuit in place of the first reference voltage.

7. The semiconductor device according to claim 1, wherein the analog-to-digital conversion circuit comprises:
an adder circuit that adds the analog signal and a feedback signal;
a loop filter circuit that smooths an output of the adder circuit;
a digital conversion circuit that converts the output signal of the loop filter circuit into a digital output value;
a decoder that decodes the digital output value and outputs a feedback digital value; and
a digital-to-analog conversion circuit that converts the feedback digital value into the feedback signal with reference to the first reference voltage and the second reference voltage,
wherein the decoder has a first decode rule for use during the first conversion phase and a second decode rule for use during the second conversion phase, and
wherein an output of the decoder using the first decode rule for a digital value is an opposite value to an output of the decoder using the second decode rule for the digital value.

8. The semiconductor device according to claim 7, wherein the feedback digital value comprises a plurality of bits, and
wherein the digital-to-analog converter generates the feedback signal based on the plurality of bits.

9. The semiconductor device according to claim 7, further comprising a decode control circuit that selects one of the first and second decode rules based on a magnitude relation between the first reference voltage and the second reference voltage.

10. The semiconductor device according to claim 7, further comprising:
a digital filter circuit that performs a filtering process on the digital output value; and
output logic circuit that generates output data including a digital code according to a magnitude of the analog signal based on the digital output value processed by the digital filter circuit.

11. The semiconductor device according to claim 10, further comprising an arithmetic circuit that calculates a resistance value of the sensor resistance based on an average value of the first output data output in the first conversion phase and the second output data output in the second conversion phase.

12. The semiconductor device according to claim 1, wherein the analog-to-digital conversion circuit comprises:
an adder circuit that adds the analog signal and a feedback signal;
a loop filter circuit that smooths an output of the adder circuit;
a digital conversion circuit that converts the output signal of the loop filter circuit into a digital output value;
a digital-to-analog conversion circuit that converts the digital output value into the feedback signal with reference to the first reference voltage and the second reference voltage; and
a reference voltage switching circuit that switches a path for transmitting the first reference voltage and the second reference voltage to the digital-to-analog conversion circuit based on the first conversion phase and the second conversion phase.

13. The semiconductor device according to claim 12, further comprising:
a digital filter circuit that performs a filtering process on the digital output value; and
output logic that generates output data including a digital code according to a magnitude of the analog signal based on the digital output value processed by the digital filter circuit.

14. The semiconductor device according to claim 13, further comprising an arithmetic circuit that calculates a resistance value of the sensor resistance based on an average value of the first output data output in the first conversion phase and the second output data output in the second conversion phase.

15. A semiconductor device comprising:
an analog-to-digital conversion circuit that receives a voltage at a node between a first resistor and a second resistor connected in series; and
an arithmetic circuit that calculates a resistance value of the second resistor from output data of the analog-to-digital conversion circuit,
wherein the analog-to-digital conversion circuit outputs first output data in a first conversion phase in which a first reference voltage is applied to the first resistor and a second reference voltage lower than the first reference voltage is applied to the second resistor and outputs second output data in a second conversion phase in which the second reference voltage is applied to the first resistor and the first reference voltage is applied to the second resistor, and
wherein the arithmetic circuit calculates the resistance value of the second resistor based on an average value of the first output data and the second output data.

16. The semiconductor device according to claim 15, further comprising a pre-buffer provided between the node and the analog-to-digital conversion circuit.

17. The semiconductor device according to claim 15, wherein the analog-to-digital conversion circuit includes:
- a digital-to-analog conversion circuit that operates with reference to voltages applied to a first reference voltage input terminal and a second reference voltage input terminal;
- an adder circuit that adds an input signal to the analog-to-digital conversion circuit and an output signal of the digital-to-analog conversion circuit;
- a comparator that converts an output signal of the adder into a digital value; and
- a decoder that converts the digital value based on a predetermined rule and outputs the converted digital value to the digital-to-analog conversion circuit,
- wherein in the first conversion phase, the first reference voltage is applied to the first reference voltage input terminal, the second reference voltage is applied to the second reference voltage input terminal, the decoder outputs the digital value as the converted digital value, and
- wherein in the second conversion phase, the second reference voltage is applied to the first reference voltage input terminal, the first reference voltage is applied to the second reference voltage input terminal, and the decoder generates the converted digital value by inverting the digital value.

18. The semiconductor device according to claim 15, further comprising:
- a reference voltage generating circuit that selects one of the first reference voltage and the second reference voltage to output from a first node and selects the other of the first reference voltage and the second reference voltage to output from a second node, the selection being made in a time division manner;
- a first buffer that outputs a voltage of the first node to the first resistor; and
- a second buffer that outputs a voltage of the second node to the second resistor.

19. The semiconductor device according to claim 18, further comprising:
- first and second switches; and
- a switch control circuit,
- wherein the first buffer is an operational amplifier,
- wherein the first switch is disposed between an output of the operational amplifier and an inverting input of the operational amplifier,
- wherein the second switch is disposed between the node and the inverting input of the operational amplifier,
- wherein the switch control circuit turns off the first switch and turns on the second switch during first pre-charge period after the selection is made,
- wherein the switch control circuit turns on the first switch and turns off the second switch after the first pre-charge period.

* * * * *